(12) United States Patent
Ullmann et al.

(10) Patent No.: US 9,018,536 B2
(45) Date of Patent: Apr. 28, 2015

(54) LAYERED BODY, PRODUCTION METHOD AND USE THEREOF

(75) Inventors: Andreas Ullmann, Zirndorf (DE); Mathias Maul, Burgthann (DE)

(73) Assignee: PolyIC GmbH & Co. KG, Fürth (DE)

( * ) Notice: Subject to any disclaimer, the term of this patent is extended or adjusted under 35 U.S.C. 154(b) by 58 days.

(21) Appl. No.: 14/006,211

(22) PCT Filed: Mar. 22, 2012

(86) PCT No.: PCT/EP2012/055109
§ 371 (c)(1),
(2), (4) Date: Oct. 23, 2013

(87) PCT Pub. No.: WO2012/126996
PCT Pub. Date: Sep. 27, 2012

(65) Prior Publication Data
US 2014/0060909 A1    Mar. 6, 2014

(30) Foreign Application Priority Data

Mar. 22, 2011 (DE) .......................... 10 2011 014 748

(51) Int. Cl.
| | |
|---|---|
| H05K 1/02 | (2006.01) |
| H05K 3/46 | (2006.01) |
| H05K 1/14 | (2006.01) |
| B32B 38/00 | (2006.01) |
| G06F 3/041 | (2006.01) |

(Continued)

(52) U.S. Cl.
CPC ............ *H05K 1/0298* (2013.01); *H05K 3/4611* (2013.01); *H05K 1/144* (2013.01); *B32B 38/0012* (2013.01); *B32B 2309/105* (2013.01); *B32B 2457/208* (2013.01); *G06F 3/041* (2013.01); *G06F 3/044* (2013.01); *G06F 3/045* (2013.01); *G06F 2203/04103* (2013.01); *G06F 2203/04107* (2013.01); *G06F 2203/04112* (2013.01); *G06F 2203/04111* (2013.01); *H05K 3/00* (2013.01)

(58) Field of Classification Search
CPC ... H05K 1/144; H05K 3/4611; H05K 3/4614; H05K 3/4617; H05K 3/462
See application file for complete search history.

(56) References Cited

U.S. PATENT DOCUMENTS

| 5,159,159 A | 10/1992 | Asher |
| 6,473,074 B1 | 10/2002 | Okahashi |

(Continued)

FOREIGN PATENT DOCUMENTS

| DE | 202006014244 U1 | 3/2007 |
| DE | 102009014757 A1 | 10/2010 |

(Continued)

OTHER PUBLICATIONS

Examination report related application DE10 2011 014 748.9 dated Sep. 23, 2011.

(Continued)

*Primary Examiner* — Jeremy C Norris
(74) *Attorney, Agent, or Firm* — William Squire

(57) ABSTRACT

The invention relates to a layered body, in particular one with two sheets of electric functional layers, as well as a use of this layered body for example in a touch screen with improved resolution. By changing the grid structure at the intersection areas a moiré effect can be avoided by superimposition of the patterns.

38 Claims, 20 Drawing Sheets

(51) Int. Cl.
  *G06F 3/044*  (2006.01)
  *G06F 3/045*  (2006.01)
  *H05K 3/00*  (2006.01)

(56) References Cited

U.S. PATENT DOCUMENTS

| | | |
|---|---|---|
| 2004/0239650 A1 | 12/2004 | Mackey |
| 2009/0219258 A1 | 9/2009 | Geaghan et al. |
| 2010/0230181 A1 | 9/2010 | Suzuki |
| 2011/0102370 A1 | 5/2011 | Kono et al. |
| 2012/0193130 A1 | 8/2012 | Fix et al. |

FOREIGN PATENT DOCUMENTS

| | | |
|---|---|---|
| DE | 102009058138 A1 | 6/2011 |
| EP | 0665508 B1 | 8/1995 |
| EP | 2330488 A1 | 6/2011 |
| GB | 2469386 B | 10/2010 |
| WO | WO95/27334 | 10/1995 |
| WO | WO2006/075121 A2 | 7/2006 |
| WO | WO2010/013679 A1 | 2/2010 |
| WO | WO2010/108692 A2 | 9/2010 |
| WO | WO2011/096580 A1 | 9/2011 |

OTHER PUBLICATIONS

Examination report related application DE10 2011 111 506.8 dated May 3, 2012.
Examination report related application DE10 2011 115.851.4 dated Aug. 8, 2012.
Int'l search report and written opinion dated Nov. 2, 2012.
2nd written opinion related application dated Sep. 18, 2013.
Int'l search report and written opinon related applicatiom dated Sep. 21, 2012.

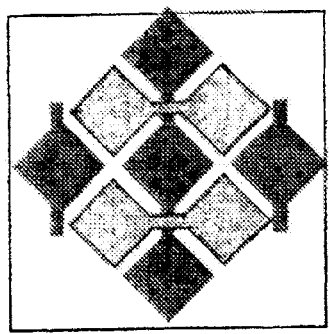
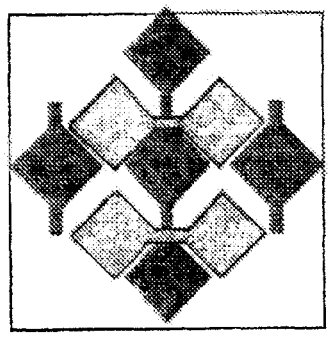
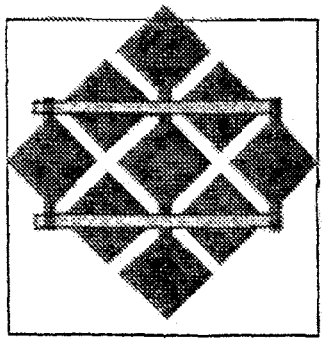
FIG. 4b PRIOR ART
FIG. 4c PRIOR ART
FIG. 4e
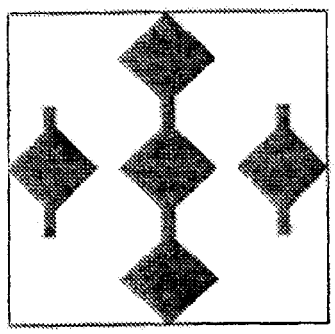
FIG. 4a
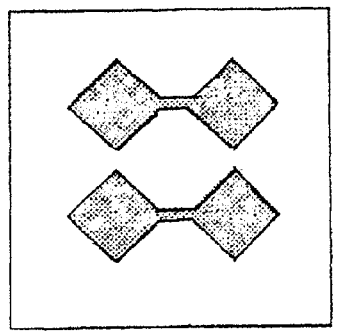
FIG. 4d

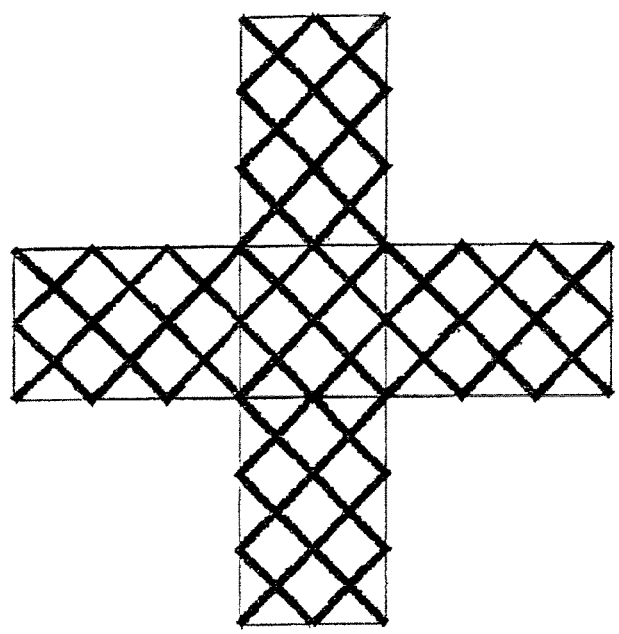
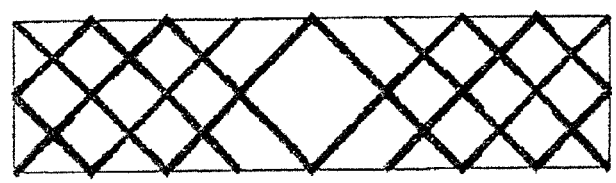
Fig. 5

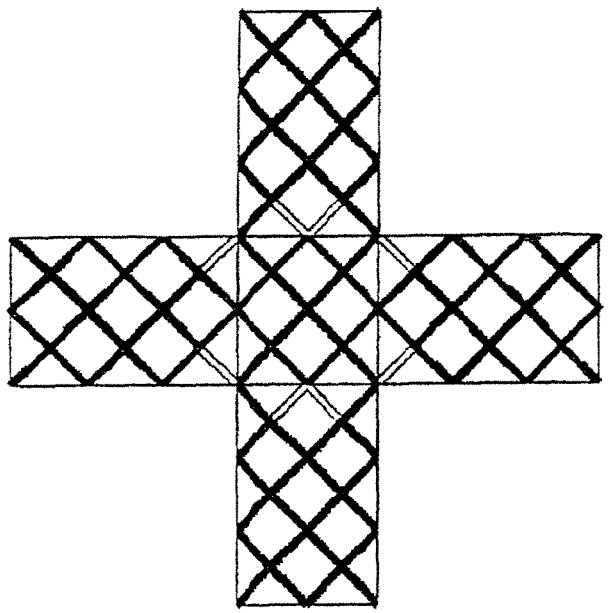
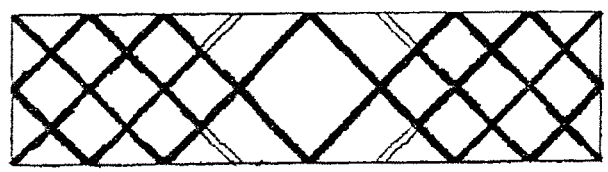
Fig. 6

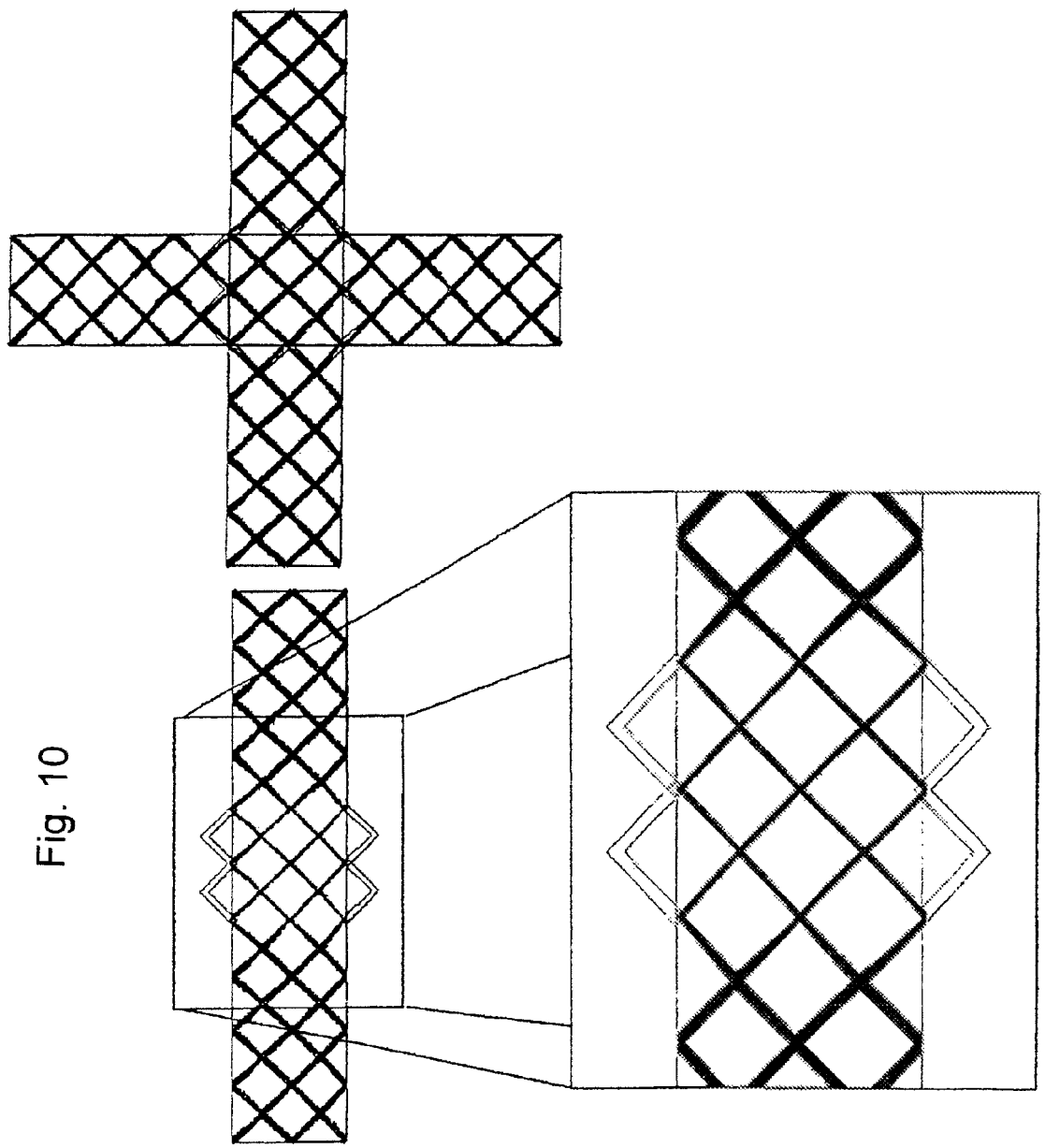
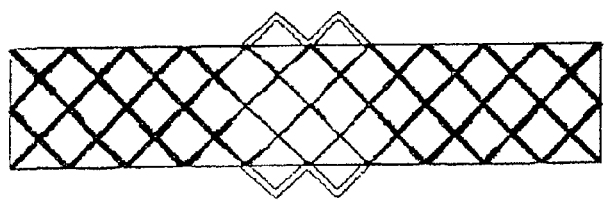
Fig. 10

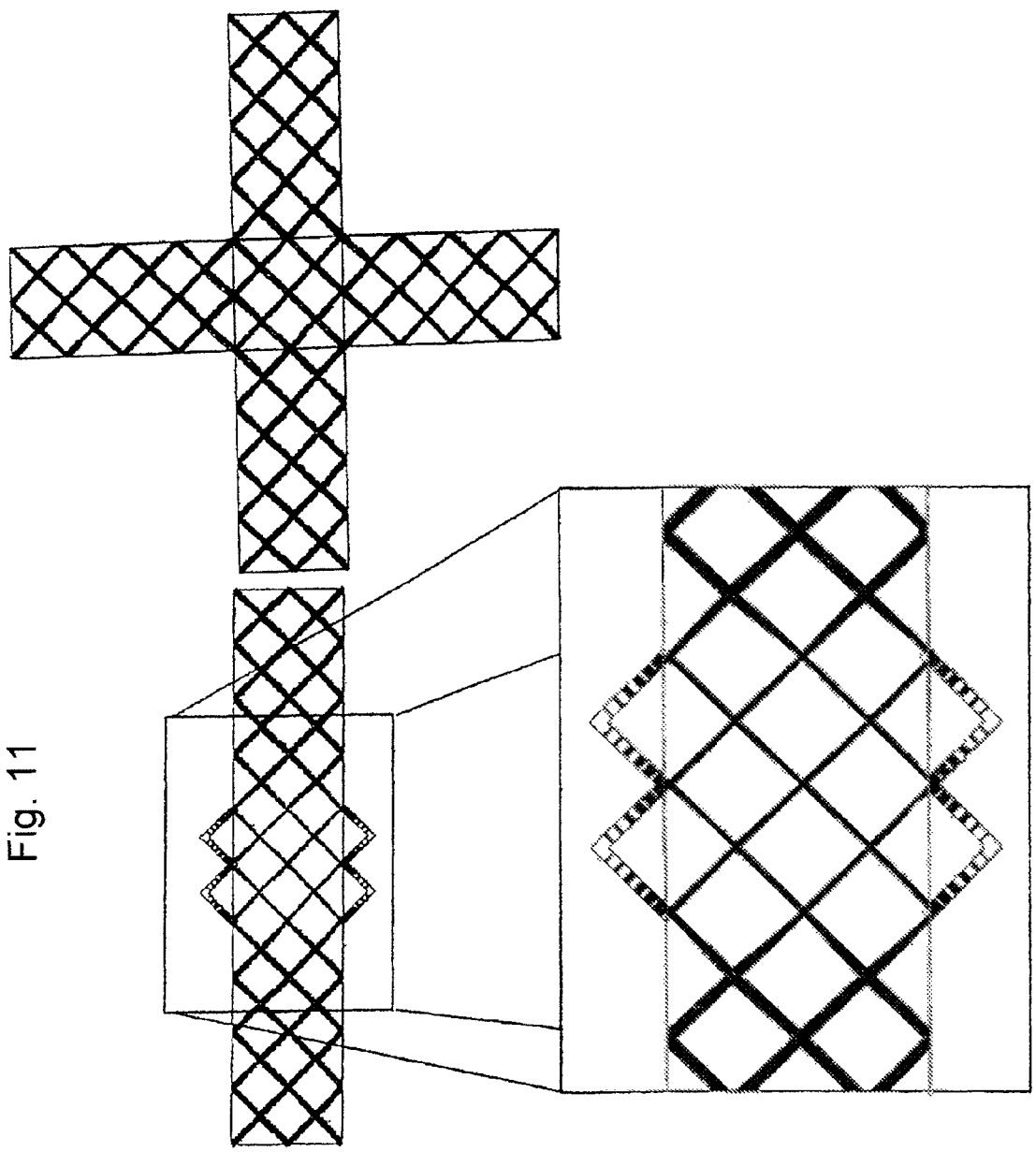
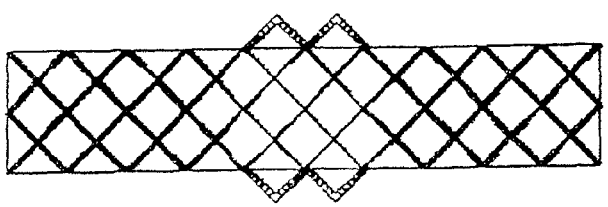
Fig. 11

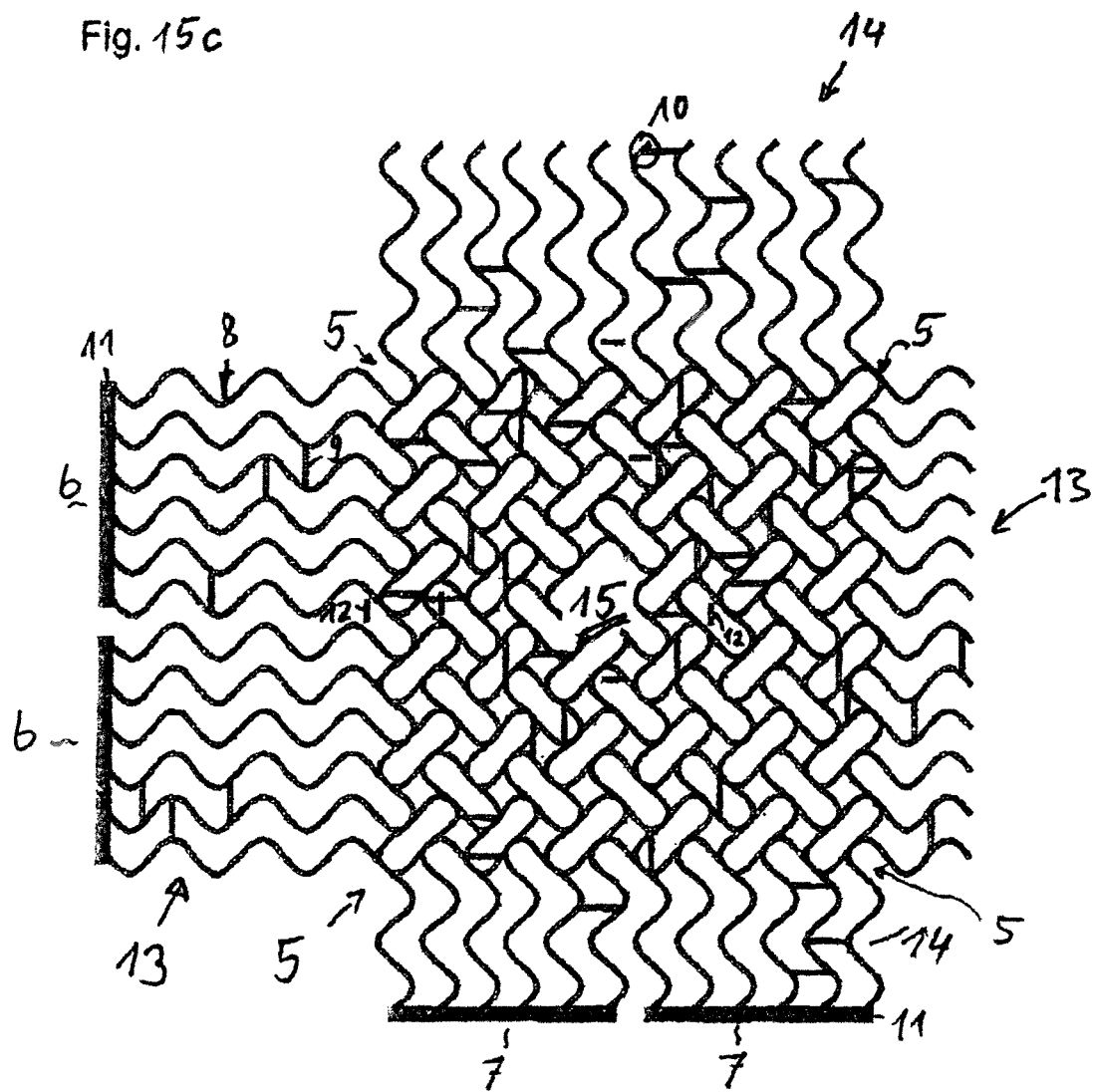

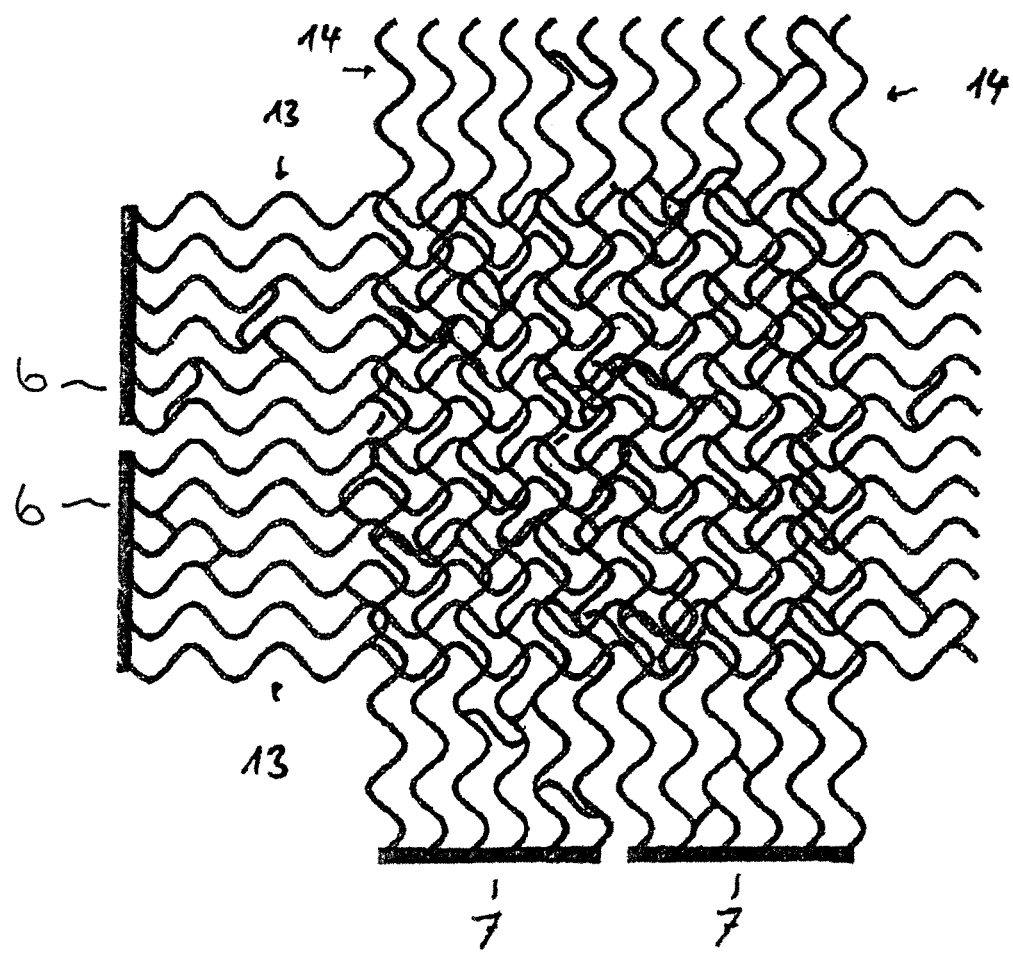

LAYERED BODY, PRODUCTION METHOD AND USE THEREOF

The invention relates to a layered body, in particular one with two sheets of electrically conductive functional layers, as well as a production method and a use of this layered body for example in a touch screen with improved resolution.

From DE 10 2009 014 757 an electric functional layer is known, in which conductive, non-transparent paths are arranged on the surface of a transparent support forming a pattern in such a way that the functional layer is transparent to the human eye and is nevertheless electrically conductive.

A disadvantage of a layered body with only one electric functional layer is that here detection is possible in only one direction. There is therefore a need for layered bodies which have combined two sheets of electric functional layers, for example stacked at an angle in the range of from 85° to 95° in a layer construction.

Because of the grid and an undesired, not quite accurately-fitting superimposition in the layered body, the use of grid structures involves varying degrees of absorption or brightness of the layered body due to the known moiré effect (see FIG. 3). There is a risk that the transparency of the grid structures of the conductor paths, which are themselves invisible to the human eye, will be completely lost in the layer construction due to the moiré effect. A superimposition of the grid structures sufficiently accurately-fitting to avoid moiré effects can only be achieved at great cost and is not economical, as even the slightest differences between the superimposed grid structures, such as for example a difference of only 10 µm, can lead to the moiré effect.

The object of the present invention is therefore to provide construction for a layered body and in particular an arrangement of conductor paths on a transparent support, such as transparent electrically conductive functional layers with non-transparent conductor paths at least in a layer construction of two sheets which can be mass-produced without the moiré effect impairing or destroying the transparency of the layered body.

The solution to the object and the subject of the invention are disclosed in the present description, the claims and the figures.

Accordingly a subject of the invention is a layered body, at least two sheets of electrically conductive and transparent functional layers with conductive, non-transparent conductor paths on at least one transparent support, so extensive that individual conductor paths or grid structures consisting of conductor paths of a first sheet form intersection areas with individual conductor paths or grid structures of the second sheet in the layer construction, wherein at least one of the two sheets has a grid structure consisting of conductor paths, which has a difference in periodicity, in particular a non-periodic, i.e. irregular difference in the periodicity of the grid structure and in particular wherein at least one of the two sheets has a grid structure consisting of conductor paths which is non-periodic.

The periodicity of a grid structure is the distance at which lines that are parallel to each other and are approximately equally bold or thick, occur or return in the grid.

Preferably, or more first of the conductor paths in the conductor path pattern are arranged substantially parallel to each other and/or run substantially in the long direction of the respective conductor path segment. By conductor paths arranged substantially parallel to each other is meant conductor paths with a constant gap between them, variable within +/−25%. By conductor paths running substantially in the longitudinal direction of the respective conductor path segment is meant conductor paths, the central longitudinal axis of which does not deviate by more than 30° from the central longitudinal axis of the conductor path segment.

It is however also possible that two or more of the first conductor paths are arranged substantially parallel to each other, but do not run the longitudinal direction of the respective electrode segment.

The grid constant indicates the specific value of the distance and/or the line thickness. In the present case the lines are formed by non-transparent conductor paths on a transparent support. The grid structure can cover the entire transparent support surface, it is then described as plane, but can also cover only individual areas of the support, wherein a higher-level grid structure consisting of conductor path segments is then optionally constructed by the areas with grid structures, so-called conductor path segments, on the support.

The non-periodicity of the grid structure can itself again be distributed both periodically and also randomly or quasi-randomly through to statistically.

According to an advantageous embodiment the conductor path lines running parallel to each other do not follow a straight line, but a wavy line and in particular a sine wave form.

The period of the wave function or sine function is preferably between 500 µm and 3000 µm, further preferably between 1000 µm and 1500 µm. The amplitudes of the wave or sine function are preferably between 50 µm and 1000 µm, further preferably between 150 µm and 300 µm.

The invention relates to both the embodiment in which the conductor paths, conductive areas or conductor path segments are themselves constructed from grid structures, so-called networks of non-transparent conductor paths, and also the embodiment in which a grid structure consisting of conventional conductor paths such as for example wiring, cover the entire surface of the transparent support. The conductor paths are preferably constructed from the above-named transparent conductors, i.e. from network structures of non-transparent, extremely thin conductors, for example 0.5 µm to 40 µm thick, which are arranged on a transparent support. These conductor paths are disclosed in DE 10 2009 014 757.

At least one of the two conductor path segments of the two sheets forming the layer construction is not formed over the whole surface, but is in the form of a grid structure consisting of conductor paths, i.e. formed structured.

It is however also possible that two or more of the firs conductor paths are arranged substantially parallel to each other, wherein they do not run at an angle of 90° to the terminal electrodes.

A statistical distribution of non-transparent second conductor paths that do not form a grid structure, can still optionally provided on the surface of to transparent support, for example as cross-links between the first conductor paths (see FIGS. 14 to 17).

According to a further preferred embodiment example of the invention the conductor path pattern has two or more second conductor paths, which are formed as cross-links. These cross-links preferably connect two adjacent first conductor paths to each other, i.e. two adjacent conductor paths to each other, which are arranged substantially parallel to each other. Each cross-link preferably connects only two conductor paths. The cross-links connect the two adjacent first conductor paths regular or irregular intervals. The cross-links preferably run perpendicular to the direction followed by the two adjacent first conductor paths.

Such an arrangement of conductor paths in the conductor path pattern results on the one hand in the advantage already described above, reducing waste in the production process and providing a particularly robust and economical layered body. Furthermore it also results in the advantage—in particular also with an irregular arrangement of the cross-links and the use of cross-links which connect only two adjacent conductor paths—of achieving particularly uniform conductivity over the area of the respective conductor path segment.

The cross-links, at least in areas, are distributed irregularly in the conductor path pattern and thus result in a difference in the periodicity which is optionally supplemented by the uniformly parallel arrangement of the conductor paths and thereby results in a uniform arrangement of cross-links in areas.

In the present case a body constructed of several layers, i.e. a stack of layers, on one or between several supports, is described as a layered body, which could for example be arranged as a touch screen in front of a display. In the layered body, for example, electrically conductive and transparent functional layers alternate with insulating functional layers. The base of a layered body is formed for example by a transparent support, on one side or both sides of which conductor paths are provided.

In the present case for example a functional layer, as known from DE 10 2009 014 757, is described as an electrically conductive and transparent functional layer. This functional layer can have a variable proportion of surface covered with non-transparent conductor paths. For example the surface of the functional layer is 20%, preferably 10% and particularly preferably 7% covered with non-transparent conductor paths.

Here the gap between the conductor path segments, i.e. the conductor paths of the respective first conductor paths of the conductor path pattern is selected from the range between 10 µm to 5 mm, preferably between 300 µm to 1 mm.

The conductor path segments preferably have a width of between 500 µm and 15 mm.

In the area of the difference in the periodicity of the grid structure of the electrically conductive functional layer, the coverage of the functional layer with non-transparent conductor path is more than, less than or equal to the density of coverage outside the area.

The width of the conductor paths can vary in the same way. For example the width of a non-transparent conductor path is less than 40 µm, preferably less than 30 µm and particularly preferably less than 20 µm.

The distance between the conductor paths in the grid structure can vary according to the embodiment, thus for example in the functional layer a distance between the conductor paths of at least 100 µm, preferably of at least 300 µm is realized.

The thickness of the non-transparent conductor path on the transparent support is preferably less than 250 nm, in particular less than 200 nm and quite preferably less than 100 nm.

The non-transparent conductor paths are for example made of metal or an alloy. Metals which have good conductivity and can for example also be processed by printing, such as copper, silver, aluminum and/or chromium can be used here.

The transparent support is for example made of transparent plastic such as polyethylene, polycarbonate and/or polyamide, as well as any mixtures thereof.

A plastic film, for example a PET film with a layer thickness of between 18 µm and 450 µm can also be used as transparent support.

According to an advantageous embodiment the—vertical—distance between the two conductive functional layers lying on the at least one support within the layered body is for example less than 30 µm, preferably less than 25 µm and particularly preferably less than 10 µm.

The conductor path segments of the conductor path pattern are preferably electrically connected parallel to each other.

The arrangement of such a functional layer within or as a base for the layered body is simply understood as a sheet of electrically conductive and transparent functional layer with non-transparent conductor paths on a transparent support, which is generally formed as transparent film.

According to an embodiment of the invention the difference the periodicity of the grid structure is limited to the area of the intersection areas as well as the edge area of the intersection areas of the two sheets arranged on top of one another.

According to an advantageous embodiment the difference periodicity is realized in such a way that individual conductor paths are realized interrupted or tapered (i.e. thinner) or dotted, i.e. interrupted or discontinued at the intersection areas, but instead, corresponding conductor paths which lie in the periodicity of the grid structure but on the second level or layer, complete the grid structure to full periodicity in terms of the number and strength of the conductor paths.

The intersection areas can also be connected by through-contacts.

The through-contacts are for example merely simple structures or holes in the insulation layers separating the two sheets of conductive functional layers in the layered body.

It is shown that the small tolerance in the accurately fitting overlapping which leads to moiré effects, becomes insignificant if the grids are completed on different levels only to form a whole in each case. The accuracy of fit required for this can be realized with commercial production methods and thus economically.

According to a particular embodiment the non-periodicity of the grid structure is not abrupt, but there is an edge area in which there is a smooth transition between the conductor path arrangements and/or conductor path shapes forming the non-periodicity (FIGS. 6 to 9 below).

According to an advantageous embodiment the grid structure of one of the functional layers involved is for example realized as follows: At the intersection areas the periodicity of the grid structure is halved, at the regions outside the intersection areas the complete grid structure is realized and the edge area of the intersection areas forms a transitional area in which half of the conductor paths end (see FIGS. 8 to 12). A non-periodicity then results because the areas in which the grid structure is halved are not distributed uniformly, i.e. periodically, over the surface of the sheet.

The conductor path segments of the first and/or second sheet in the region of the intersection point preferably have more than 4 and in particular more than 6 conductor paths, preferably between 4 and 16 conductor paths.

In a further embodiment of the invention, in an active area of the layered body the average area coverage is constant relative to a surface area of 5 mm×5 mm, in particular 3×3 mm, further preferably 1×1 mm, further preferably 0.5×0.5 mm, further preferably 0.3×0.3 mm of the first and/or second sheet and/or conductor path segments with the conductor paths, in particular with the conductor paths of the grid structure.

According to a further advantageous embodiment of the invention, in an active area of the layered body the average area coverage of the projection of the conductor paths of the first and second sheets onto a substrate arranged parallel to the first and second sheets is constant relative to a surface area of 5 mm×5 mm, in particular 3×3 mm, further preferably 1×1 mm, further preferably 0.5×0.5 mm, further preferably 0.3×0.3 mm.

According to a further advantageous embodiment of the invention the average area coverage of the projection of the conductor paths of the first and second sheets onto a substrate arranged parallel to the first and second sheets constant when the grid structures consisting of conductor paths of the first sheet and of the grid structures consisting of conductor paths of the second sheet are displaced by a length of not more than 5 mm, in particular not more than 3 mm and preferably not more than 1 mm and/or rotated through an angle of not more than 10° in particular not more than 5° and in particular not more than 3°.

According to a further preferred embodiment of the invention the grid structure consisting of conductor paths is non-periodic over the entire active area of the layered body, over the entire conductor path segment or in areas.

According to a further preferred embodiment of the invention the first conductor paths arranged substantially parallel to each other are connected by a plurality of second conductor paths.

According to an embodiment of the invention the surface covered by the second conductor paths is less than 50, in particular less than 30, in particular less than 10% of the surface covered by the first conductor paths and the second conductor paths.

According to a next embodiment of the invention the second conductor paths are arranged randomly or quasi-randomly, in particular at a random or quasi-random distance from each other. It can in particular be provided that the second conductor paths are arranged substantially parallel to each other. In particular the second conductor paths and the first conductor paths can be at an angle of between 80 degrees and 100 degrees, in particular between 85 degrees and 95 degrees to each other.

According to a further embodiment of the invention the conductor path pattern of a conductor path segment is formed in such a way that the azimuth angle of the first conductor paths is varied according to a function, in particular according to a periodic function.

According to a further embodiment of the invention the first conductor paths are oriented parallel to a first preferred direction and/or the direction of the first conductor paths, averaged over a period in each case, parallel to a first preferred direction. The preferred direction can run parallel to the length of the conductor path segment, or at an angle within the range of from 85° to 95° thereto, as well as at any other angle to the length of the conductor path segment and/or to the terminal electrode.

The spatial frequency, amplitude and/or phase of the function varying the azimuth angle of the first conductor paths in a first portion can be selected different relative to an adjacent portion, wherein the difference between the spatial frequency, amplitude or phase of the first portion and that of the adjacent portion is between 4% and 8%, in particular less than 10%.

The first and/or second conductor paths that form the grid structure, i.e. also the conductor path pattern, can in each case or simultaneously be formed in such a way that a plurality of first and second portions follow each other and the difference between the spatial frequency, amplitude or phase of the function of consecutive first and second portions of the conductor paths is selected randomly or quasi-randomly.

An advantageous embodiment of the invention provides that the first sheet and the second sheet have a grid structure consisting of conductor paths and in particular both the grid structure consisting of conductor paths of the first sheet and also the grid structure consisting of conductor paths of the second sheet are non-periodic.

According to an advantageous embodiment of the invention it is provided that the grid structure consisting of conductor paths of the first sheet has a plurality of first conductor paths arranged substantially parallel, and a plurality of second conductor paths which are transverse conductor paths, which in each case connect two or more of the first conductor paths, and the grid structure consisting of conductor paths of the second sheet has a plurality of first conductor paths arranged substantially parallel, and a plurality of second conductor paths which are transverse conductor paths, which in each case connect two or more of the first conductor paths of the second sheet.

Furthermore, it can be provided that the first conductor paths and/or conductor path segments of the first sheet and the first conductor paths and/or conductor path segments of the second sheet are, at least in areas, at an intersection angle of between 85° and 95° to each other in each case, in particular the preferred direction of the first conductor paths and/or conductor path segments of the first sheet and the preferred direction of the first conductor paths and/or conductor path segments of the second sheet are at an angle of between 85° and 95° to each other.

For example it can also be provided that the preferred direction of the first conductor paths of the first and/or the second sheet and/or the preferred direction of the second conductor paths are not oriented parallel to the connecting line between the terminal electrodes of the respective conductor path segment, but are in particular at an angle of approximately 45 degrees to the straight line connecting the terminal electrodes of the respective conductor path segment.

During the production of the layered body it can in particular be advantageous if the two sheets forming the layered body, which are laminated onto a substrate with an insulating intermediate layer, originate from a single printed strip, i.e. for example are cut out from the same strip. The strip can for example be a transparent support printed with non-transparent conductor paths, as known for example from DE 10 2009 014 757. The two sheets are then identical as regards the and structure and can be produced in one operation and are for example arranged on top of one another, rotated at an angle to each other, in the layered body. The layers are preferably arranged on top of each other, rotated at an angle of between 40 degrees and 50 degrees to each other.

The invention is further described in more detail below, with the help of figures which show the state of the art in comparison with exemplary embodiments of the invention:

FIGS. 1 to 3 show the state of the prior art,

FIG. 1*a* shows a "stripe and bar" design of the prior art,

FIG. 1*b* shows a diamond structure in a schematic representation of part-areas of two separate sheets, which form intersection points in a layer construction of the prior art, FIG. 2*a* shows a schematic representation of part-areas of two separate sheets, which form intersection points in a layer construction of the prior art, FIG. 2*b* shows a desired "ideal" intersection point of the part-areas of FIG. 2*a* in the layer construction of the prior art, FIG. 2*c* shows the actual intersection point of the part-areas of FIG. 2*a* in a layer construction according to the prior art, FIG. 3 shows the resulting moire effect according to the prior art, FIGS. 4*a* to 4*e* show an embodiment of the present invention with a schematic representation of part-areas of two separate sheets in sequential stages of forming the layer construction of FIG. 4*e*, which form intersection points in the layer construction, FIGS. 5 to 8 and 10 to 12 show in detail examples of possible embodiments of the present invention that differ from that of FIGS. 4*a* to 4*b*, FIG. 9*a* shows an overview of how the state of the prior art differs from the present invention, FIG. 9*b* shows the embodiment according to FIG. 8 by way of comparison, FIG. 9c shows the embodiment according to FIG. 7 by way of comparison, FIG. 13a shows an overview of how the state of the prior art differs from the present invention, FIG. 13b shows the embodiment according to FIG. 12 by way of comparison, FIG. 13c shows the embodiment according to FIG. 11 by way of comparison, FIG. 14 shows an embodiment of the invention with a schematic representation of part-areas of two separate sheets, which form intersection points in the layer construction, wherein the difference in the periodicity is distributed statistically, FIGS. 15a and 15b show an embodiment of the present invention with a schematic representation of part-areas of two separate sheets, which form intersection points in a layer construction, FIG. 15c shows an intersection point formed by the part-areas represented in FIGS. 15a and 15b, FIGS. 16a and 16b show an embodiment of the invention with a schematic representation of part-areas of two separate sheets, which form intersection points in a layer construction, FIG. 16c shows an intersection point formed by the part-areas represented in FIGS. 16a and 16b, and FIGS. 17a and 17b show an embodiment of the present invention with a schematic representation of part-areas of two separate sheets, which form intersection points in the layer construction, and FIG. 17c shows an intersection point formed by the part-areas represented in FIGS. 17a and 17b.

FIGS. 1a and 1b show two basic possible ways of realizing capacitive or resistive two-sheet touch screens. FIG. 1a shows the realization as a row and column structure (bar and stripe) of conductor path segments, wherein a sensor, for example the receiver, is represented by thicker and darker conductor path segments arranged horizontally, and for example the transmitter by thinner segments running vertically. The present invention solves the problems which, according to the state of the art, as for example shown in FIGS. 2c and 3, result at the intersection areas due to the layer construction with the respective grid structures.

FIG. 1b shows the so-called diamond structure, wherein for example the transmitter is again represented by the lozenges or diamond structures shown horizontal and darker and, in a second, higher-level layer the receiver is lighter and arranged with the terminal contacts rotated 90°. Here too, the problem resulting from overlapping of the conductor paths at the intersection areas is solved by the present invention.

FIGS. 2a, 2b and 2c show in detail the problem addressed. On the left, two still-separate sheets of electrically conductive transparent functional layer are shown, i.e. conductor path segments 6 and 7. In each case these have first conductor paths 8, which are arranged in a diamond pattern as a grid structure. The width of the first conductor paths 8 is here preferably between 5 µm and 25 µm. The first conductor paths 8 are preferably arranged according to a regular 1 dimensional grid and adjacent first conductor paths 8 are at a substantially constant conductor path distance from each other, preferably within the range between 10 µm and 5 µm, further preferably between 300 µm and 1 mm.

FIGS. 2b and 2c on the right show the arrangement of the two sheets in the layer construction, in such a way that an intersection area results. At the top right of the image the ideal state 2b can be seen, which cannot however be realized economically for touch screens, and at the bottom right the actual state 2c, which can be achieved by current production techniques. The register tolerance or accuracy of fit with which the two grid structures are superimposed simply deviates too strongly, even in the case of resolutions micrometer range, to guarantee still-adequate brightness and transparency of the superimposed sheets in the layered body. Rather, it can be seen at the bottom right that a so-called moiré effect occurs which is to be observed with superimposition of grid structures and brings about a clear reduction in the transparency of the layered body at that point.

FIG. 3 finally shows the classic moiré effect of a layered body according to the state of the art, wherein here the effect is even further intensified by a slight angular displacement of the superimposed sheets. It is clear from the representation that this kind of overlapping cannot be tolerated but rather compromises the transparency of such a layered body made from sheets that are in themselves transparent.

FIGS. 4a to 4e show one possibility for designing the diamond structure from FIG. 1b in such a way that, in the two-sheet embodiment, in the layer construction, in fact, only the overlapping at the intersection areas of the conductor paths is problematical, and not also the displacement, as can be seen in FIG. 4c.

FIG. 4a is a quite classic prior art representation of the two sheets of the diamond structure, which are in themselves similar and partially identical, but are arranged rotated 90° with respect to the two-sheet layered body, for example a touch screen. FIGS. 4a to 4c show the state of the prior art and FIGS. 4d and 4e show the solution according to an embodiment of the present invention.

Figure 1B:
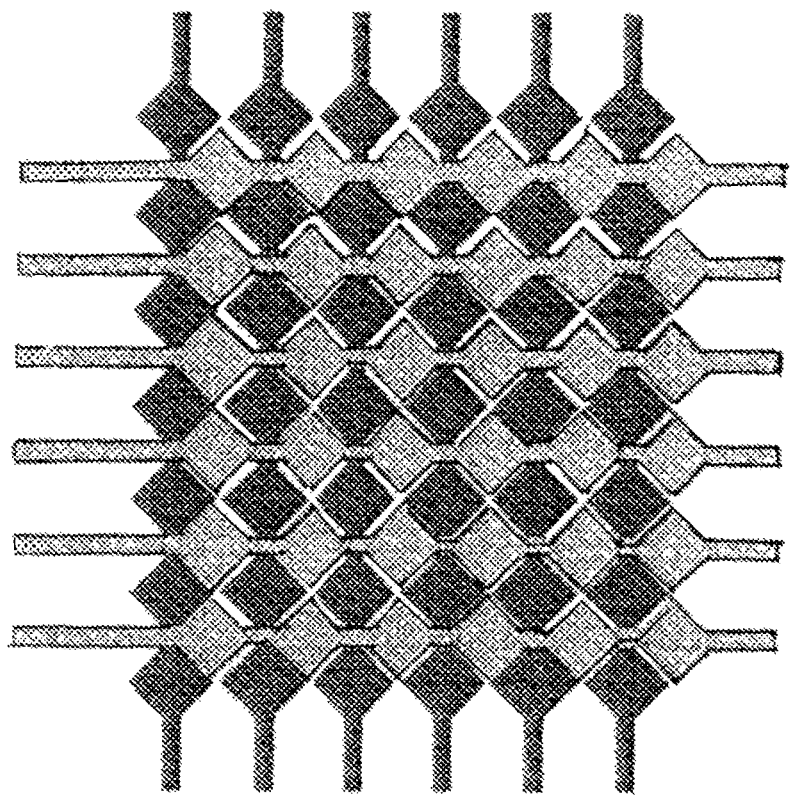
Figure 1A:
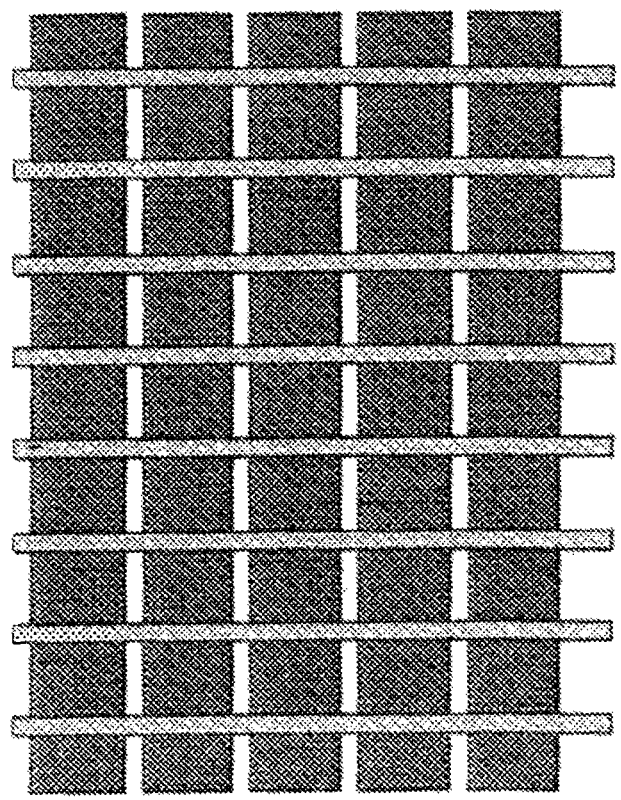
Figure 2B:
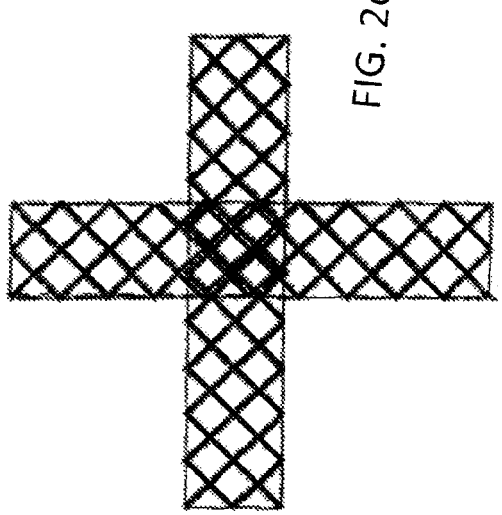
Figure 2C:
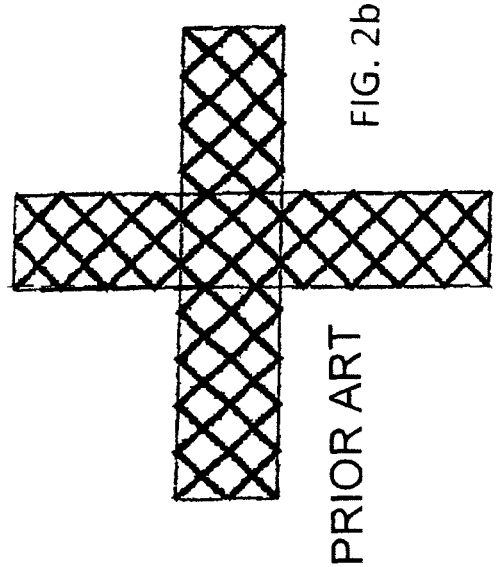
Figure 2A:
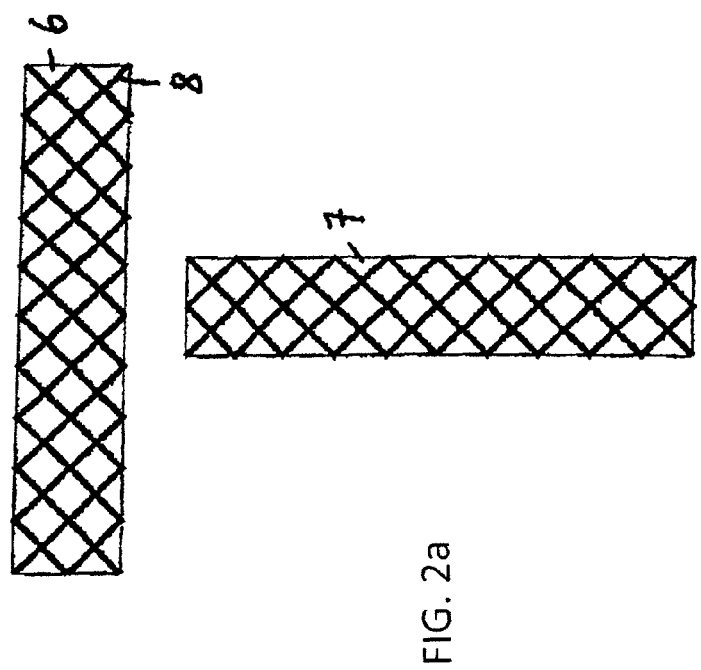
Figure 3:
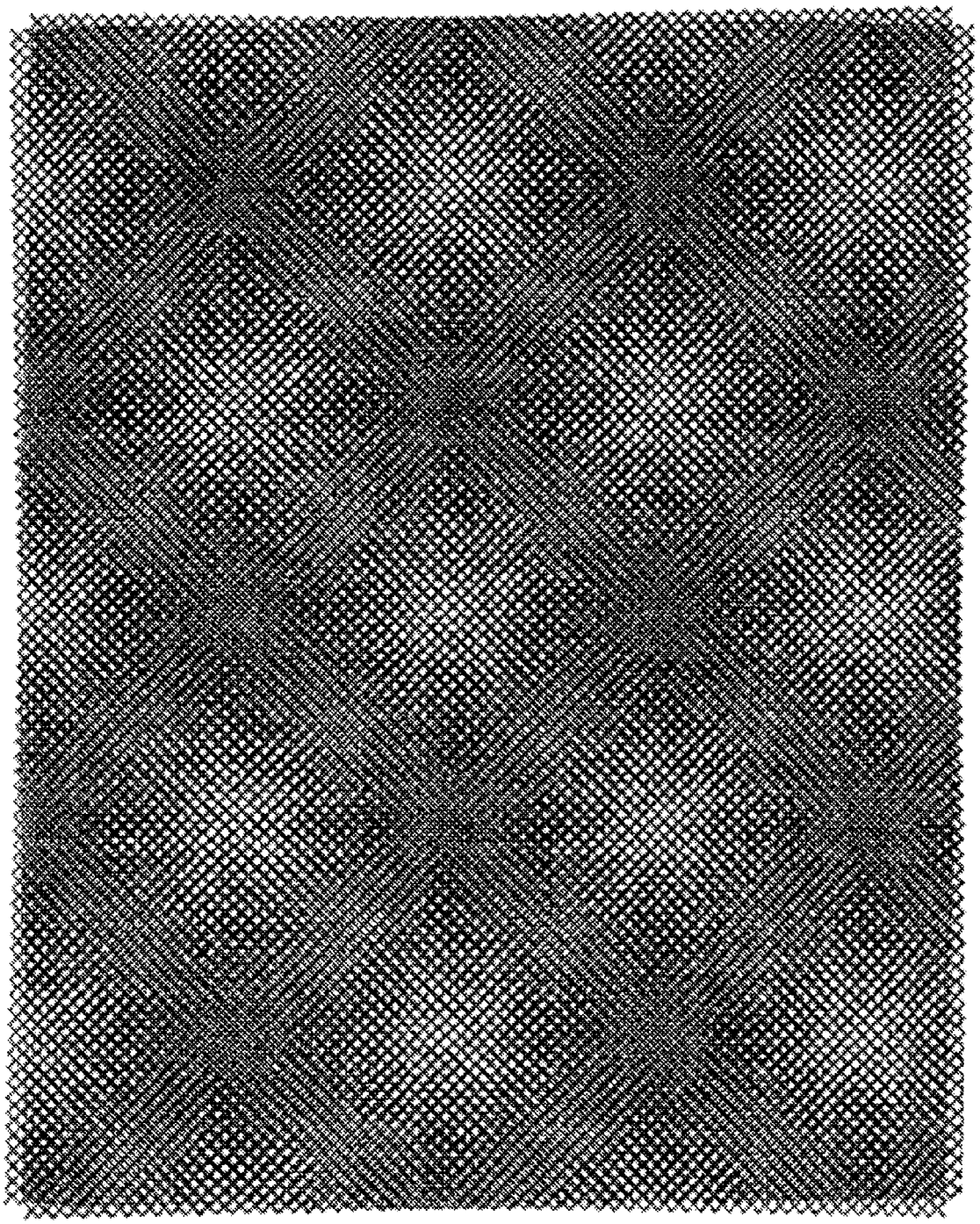

FIGS. 4b and 4c show two arrangements whereby the sheets of FIG. 4a are superimposed. Corresponding to FIGS. 2a-2c, it can be seen at the top right what the ideal case 4b with almost unachievable accuracy of fit would look like, and at the bottom, the representation of reality, FIG. 4c, wherein the individual diamond structures of the two sheets are for the most part displaced during construction of the layered body and will thus be arranged at varying distances from each other. This would lead to an unreasonable number of cases of interference, because sometimes there is practically no distance from the transmitter to the receiver (on different layers in each case) and sometimes too great a distance.

In FIG. 4d it is proposed that in one sheet only conductor paths running vertically are realized, whilst in the other sheet all the diamond structures whether transmitters or receivers, are realized in a single sheet, however without the necessary electrically conductive connection of a kind of diamond structures, wherein by "kind" is meant either the transmitter or the receiver diamond structures respectively. As shown in FIG. 4e these are connected to the conductor paths only by the second sheet.

The accuracy of fit with which the first and the second sheets according to this embodiment of the invention need to be superimposed is much less than that according to the state of the art, in which the two kinds of diamond structure are in each case realized on a separate sheet by laminating the stack to form the layered body to form the touch module.

The layer construction according to FIG. 4e thus reduces the problems that would result with a two-sheet construction of a diamond-structure touch screen, to the problem that results with the conventional row and column ("stripe and bar") structure, namely the overlapping at the intersection areas.

FIG. 5 shows a segment from a sheet of a transparent electrically conductive film with a grid structure consisting of conductive regions, here shown as simple strips running horizontally and vertically. The conductive areas show fine non-transparent conductor paths, which are again arranged in a periodic grid structure. The change in periodicity of the grid structure at the intersection area is here carried out quite simply, by halving or doubling the grid constants of the individual fine conductor paths in the area of the intersection areas. Superimposition then results in the complete pattern. Here there is absolutely no risk of any moiré effect due to overlapping, because half of the fine conductor paths are missing at the overlap points, i.e. the intersection areas.

FIG. 6 shows the same image as FIG. 5, but, where the transition from complete periodicity of the grid structure to the grid structure with differing periodicity occurs, the edge area of the intersection areas is shown by indicated lines, represented only in outline. Here the periodicity already differs from the periodicity in the original grid but not yet so much as the difference at the intersection area. There are therefore 3 areas with differing patterns here, firstly the intact grid structure not differing from the periodicity. Then there are the edge areas, where the transition from the intact periodicity to the differing periodicity is formed and then the areas directly at the intersection area, where the differing periodicity is smooth and can be achieved in clear contrast to the non-differing periodicity.

As can be seen, with differing periodicity two sheets can be formed identical on two levels, but it is also possible to omit the entire number of redundant conductor paths in one sheet or layer and leave the second sheet unchanged. In between, all possibilities can likewise be realized; the examples represented here represent only a few of countless possibilities for a person skilled in the art. There is complete freedom of design as to how the difference in the periodicity of the grid structure is realized at the intersection areas. Likewise the design of the edge areas where the transition takes place can be selected freely. In addition, irregularities resulting from manufacturing can be offset by the design of the difference in the periodicity of the grid structure and/or in the design of the edge areas.

Figure 7:
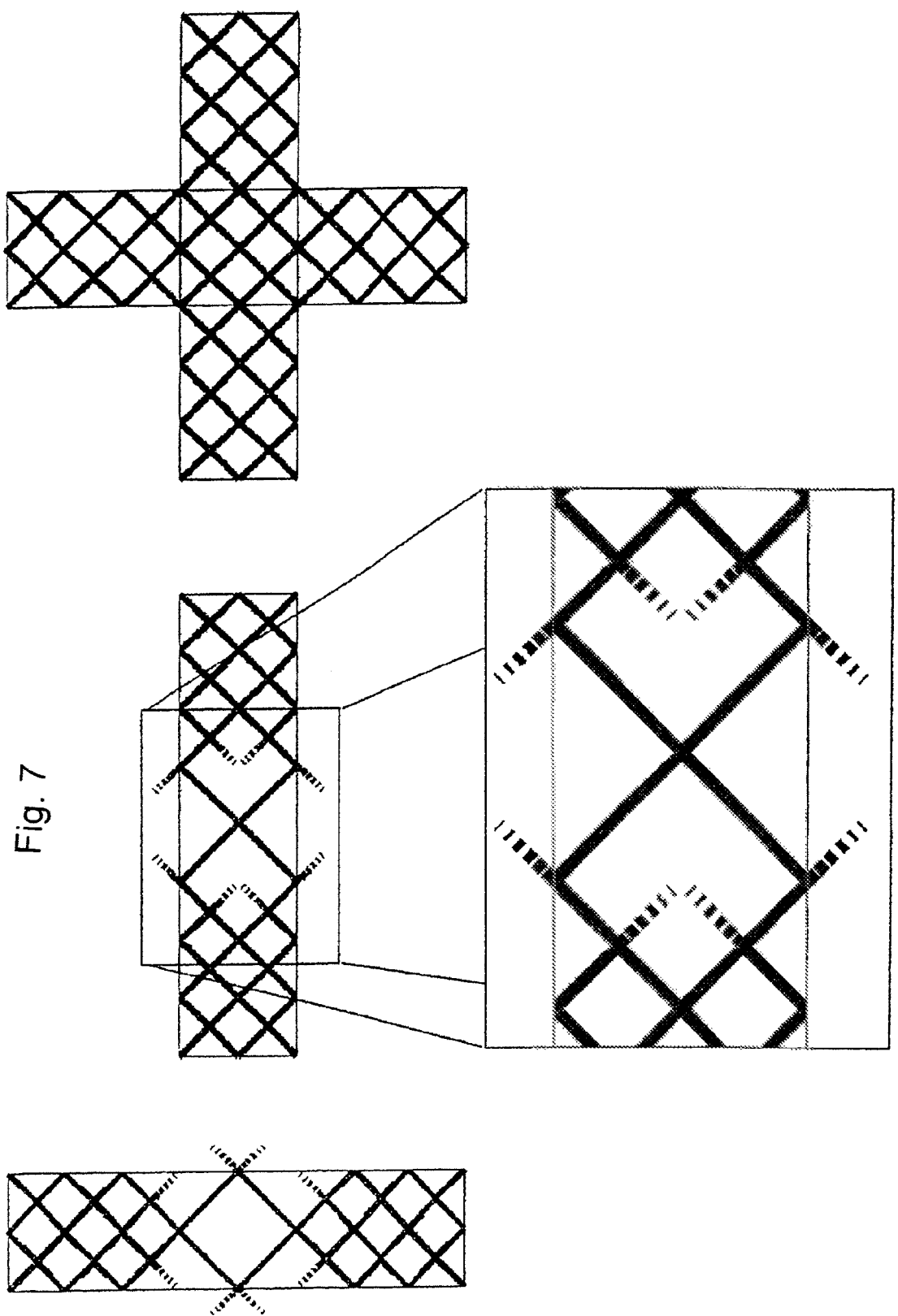

FIG. 7 shows an enlargement of the transition or edge area between the regular grid and the intersection area from the example shown in FIG. 6. There the transition occurs in the conductor paths, wherein FIG. 7 shows the embodiment in which the conductor paths slowly disappear, in that they are represented as increasingly smaller dots, with an increasing distance between them. There is a discontinuation of the conductor paths in the form of resolution into symbols such as dots, rectangles, squares, circles etc. The resolution can result firstly from the fact that here increasingly larger distances are produced between symbols remaining the same size, and/or in that the size of the distances between the symbols successively increases.

Figure 8:
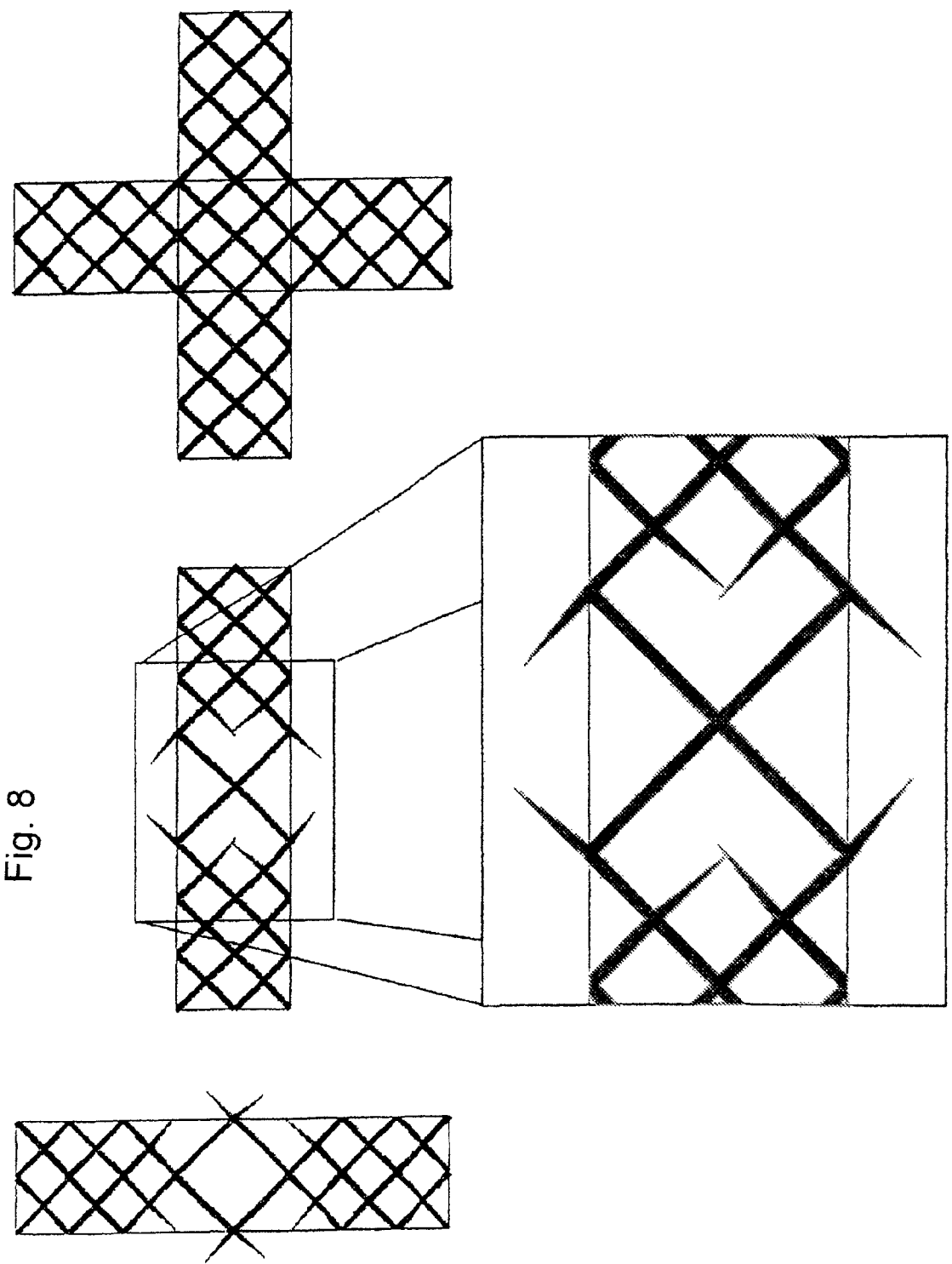

FIG. 8 shows the same segment as FIG. 7 with the difference that instead of the disappearing dots, here the conductor paths have tapered ends.

Figure 9B:
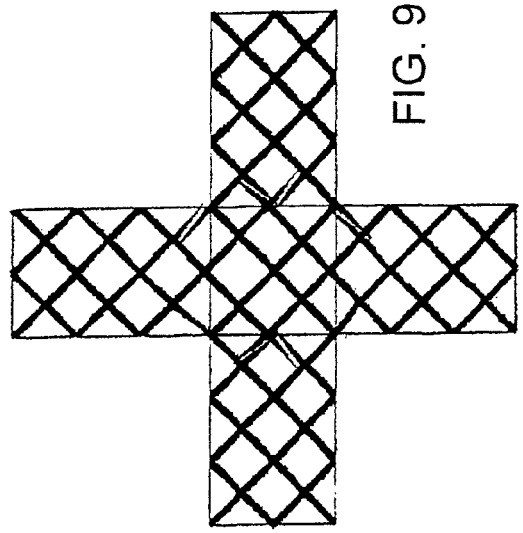
Figure 9C:
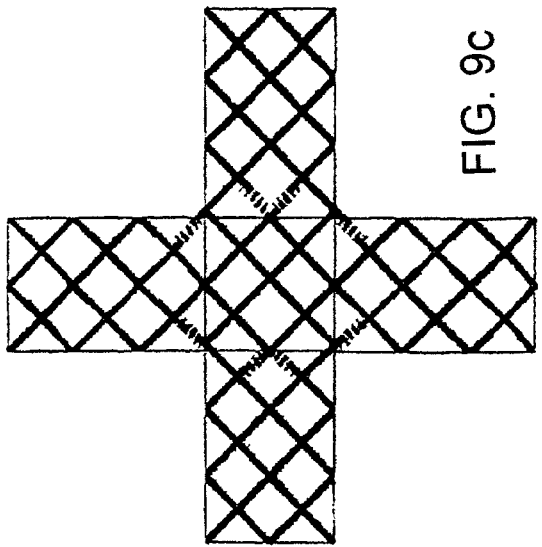
Figure 9A:
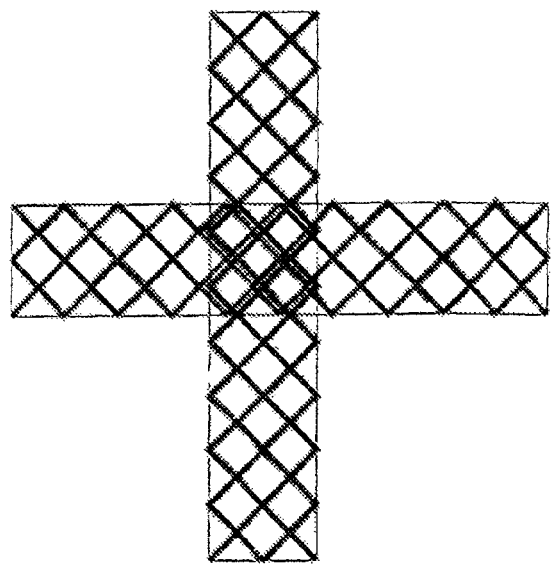

FIG. 9a shows the state of the prior art with undesired overlapping at the central intersection area and on the right at FIGS. 9b and 9c, the two embodiments shown in FIG. 7 (corresponding to FIG. 9c) and FIG. 8 (corresponding to FIG. 9b) with differing periodicity according to an embodiment of the present invention at the intersection area. FIGS. 9b and 9c clearly show that the slight difference in the accurately-fitting overlapping do not lead to a moire effect at the intersection area here and the edge area also shows no disturbance of the brightness whatever due to the transition.

Figure 12:
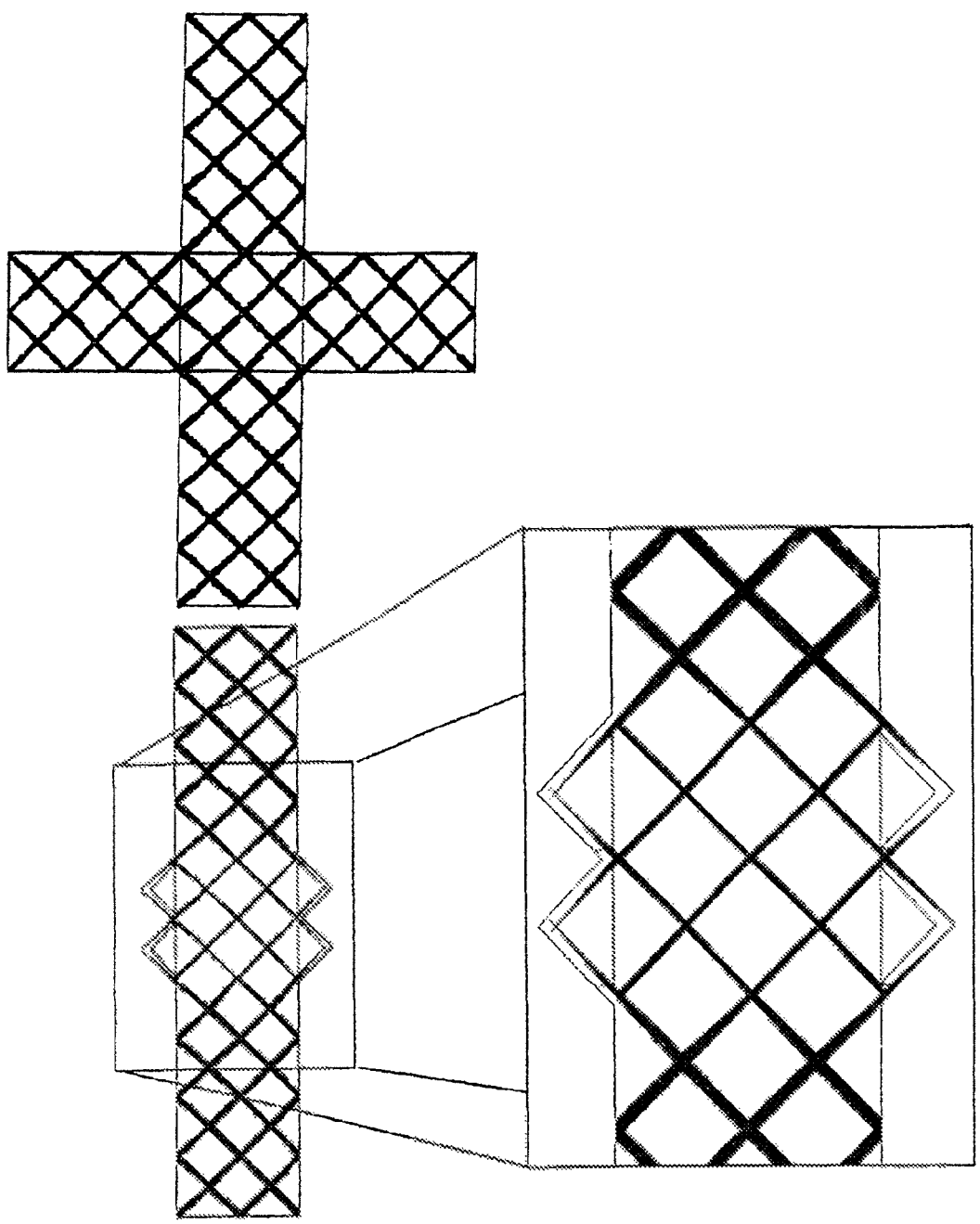

FIGS. 10, 11 and 12 again show the segment according to FIGS. 7 and 8, wherein here redundant conductor paths of a layer or sheet are not dispensed with in the area of the intersection areas, but the thickness of the conductor paths is simply changed, for example even halved. Likewise different designs of the transition areas are again shown.

For the sake of clarity, the embodiments shown in the figures are examples in which both sheets are structured in such a way that the grid constant is changed in some way at the intersection area. According to the invention, however, it is just as possible that a change in the grid structure occurs in only one of the sheets.

Figure 13B:
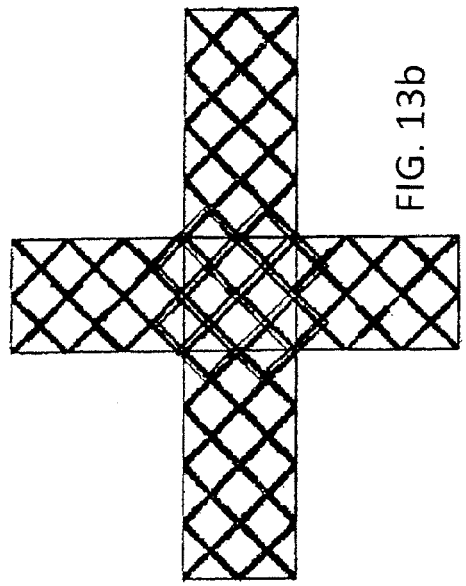
Figure 13C:
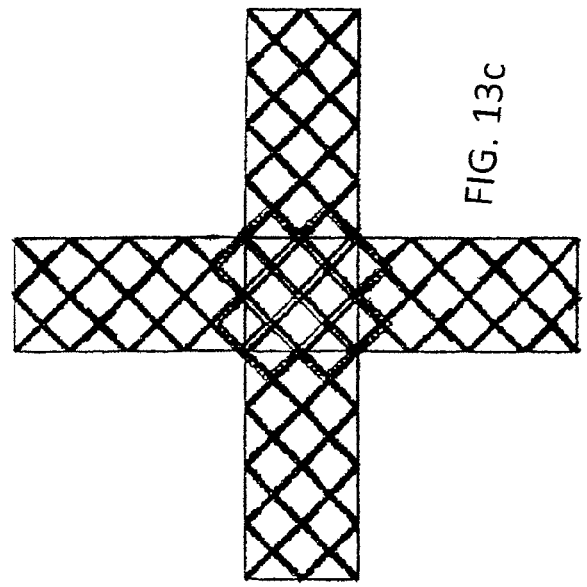
Figure 13A:
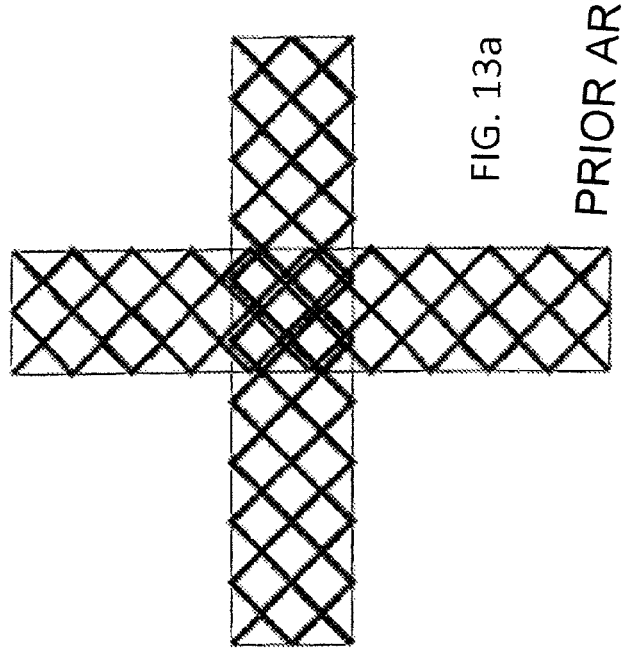

FIG. 13 shows, analogously to FIG. 9, the optical effects produced in the two-sheet layered body by the different embodiments. FIG. 13a again shows the state of the art with moiré effect at the intersection area and FIGS. 13b and 13c show intersection areas which result with the two-sheet construction of a layered body according to the embodiments shown in FIGS. 12 and 11.

Figure 14C:
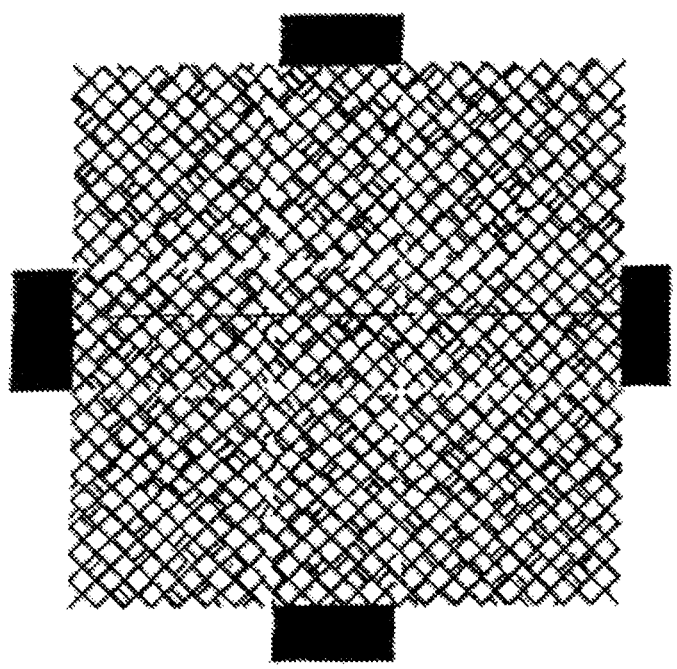
Figure 14A:
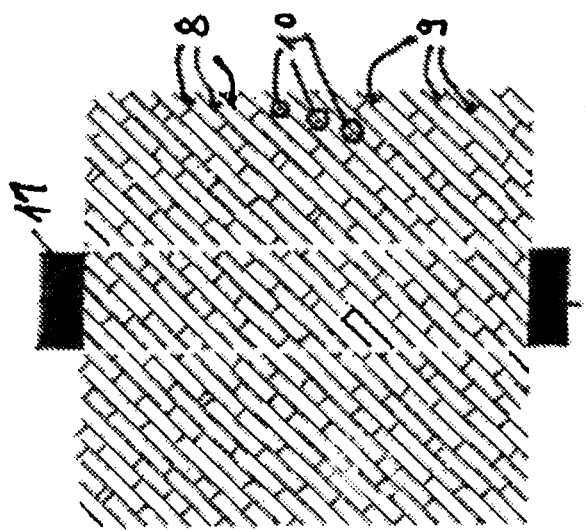
Figure 14B:
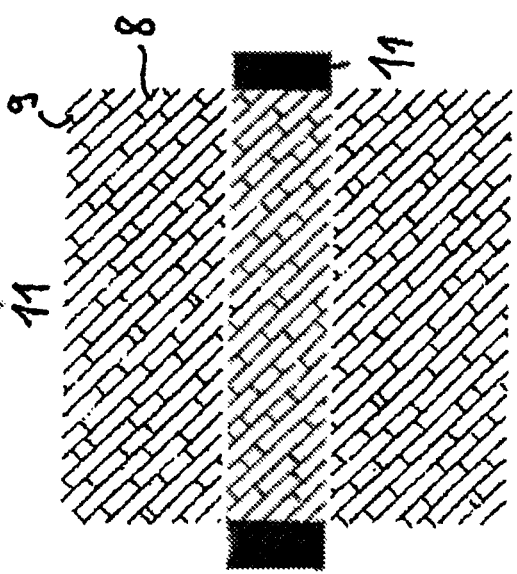

FIGS. 14a-14c show an example in which the difference in the periodicity of the grid structure is distributed statistically and is no longer limited to the area of the intersection areas as well as the edge area of the intersection areas of the two sheets arranged on top of one another, but in which the difference in the periodicity of the grid structure relates to the entire surface. The first conductor paths 8 are connected to each other by means of second conductor paths 9, which are formed as transverse conductor paths or cross-links between two adjacent first conductor paths 8. As indicated in FIGS. 14a and 14b, the two adjacent first conductor paths 8 are electrically conductively connected to each other by the second conductor paths 9 at irregular, statistically distributed intervals. At the intersection points of the first conductor paths 8 and second conductor paths 9 intersection points 10 are furthermore formed in each case, at which these conductor paths intersect and these conductor paths galvanically connect to each other.

Furthermore, according to FIGS. 14a and 14b, terminal electrodes 11 are also provided, which bring the first conductor paths 8 into contact with one another and thus ensure that the first conductor paths 8 are electrically connected parallel to each other. The terminal electrodes 11 are here located outside the active area of the layered body and preferably have a conductor path width wider than the first conductor paths 8 by at least a factor of 10.

Instead of intersecting electrically conductive areas with the two-sheet construction of a layered body with two sheets, for example of transparent electrically conductive functional layers with non-transparent conductor paths on a transparent support, here there are non-conductive areas on a base of completely-covering and conductive grid structures arranged displaced relative to each other, in which first conductor paths 8 by second conductor paths 9, which are distributed statistically. The statistical distribution of the second conductor paths 9 is here used to avoid the moiré effect.

According to FIGS. 14a-14c, the entire surface of the sheet is covered with a grid structure of fine non-transparent first conductor paths 8. The first conductor paths 8 are arranged simply parallel, wherein, in order to achieve the surface conductivity, they are connected via statistically distributed bridges which form the second conductor paths 9. This therefore results in a regular pattern of continuous lines, as is the normal case with a periodic grid structure with a statistical distribution of second conductor paths 9 therein. The statistical distribution of the second conductor paths can vary; for example it can be in a ratio of 1:3, 1:4 or 1:5.

This grid fills the whole active area of the layered body and forms the base for the superstructure which forms intersection areas when the first and second sheets are superimposed in the layered body. The active area of the layered body is the part of the layered body which is preferably transparent and on which a display, a touch module, a touch screen etc. is mounted. The terminal electrodes for example are not normally in the active area of the layered body.

The higher-level grid structure which is formed, not by areas with conductivity (as in the examples previously shown), but by areas without conductivity which lie between the conductor path segments 6 and 7, is shown on this base. In the present case, for the sake of simplicity, these non-conductive paths within a conductive surface are sometimes also called "conductor paths", although they are "non-conductor paths", and are to be understood to differ from true conductor paths, which are electrically conductive and not transparent. The higher-level grid structure here is simply two bars which represent the terminal electrodes and which are connected by two white lines. The bars are the terminal electrodes outside the active surface of the sheet and are here represented only for clarification of the white, non-conductive lines.

The statistical distribution second conductor paths 9, together with the non-conductive regions also again leads to a constant brightness in the layered body, because the statistical distribution prevents formation of a moiré effect.

Figure 15A:
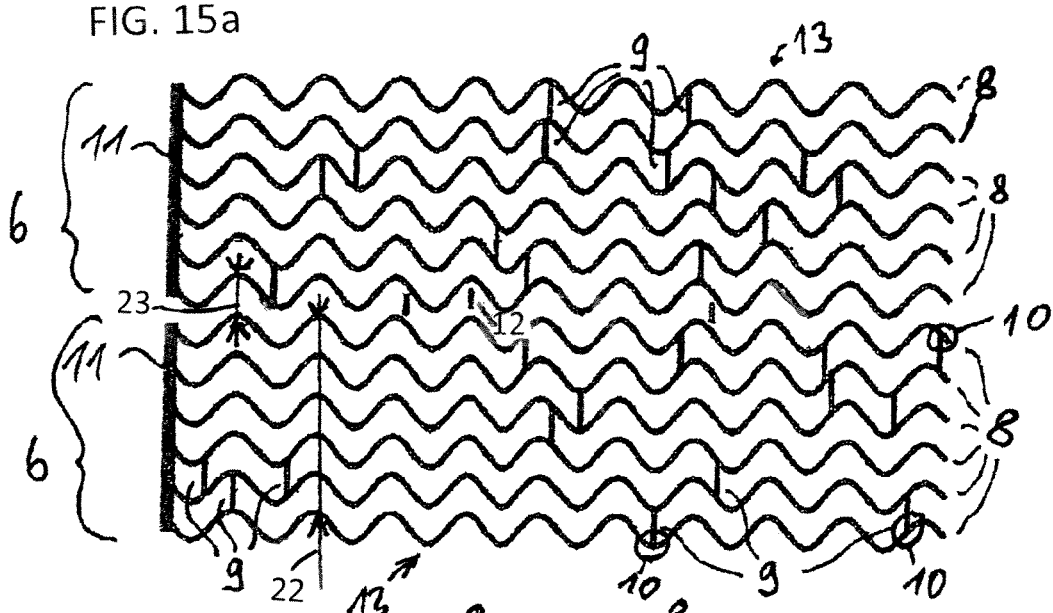

FIG. 15*a* shows a segment from a sheet with grid structure, wherein the difference in the periodicity is again not limited to the area of the intersection points but covers the entire surface and is distributed statistically as in FIG. 14.

FIG. 15*a* shows first conductor paths 8, which follow a wavy line and are arranged substantially parallel to each other. The first conductor paths 8 are preferably arranged according to a regular 1-dimensional grid and adjacent first conductor paths 8 are at a substantially constant conductor path distance from each other, preferably in the range between 10 μm and 5 mm, further preferably between 300 μm and 1 mm. Furthermore, two of the adjacent first conductor paths 8 are in each case connected to each other by means of second conductor paths 9, which are formed as cross-links between two adjacent first conductor paths 8. As indicated in FIG. 15*a*, the two adjacent first conductor paths 8 are electrically conductively connected to each other at irregular intervals by the second conductor paths 9.

Furthermore, outside the operational area, terminal electrodes 21 are also provided, which bring the first conductor paths 8 into contact with one another and thus ensure that the first conductor paths 8 are electrically connected parallel to each other. The terminal electrodes 11 here are located outside the active area of the layered body and preferably have a conductor path width that is wider than the first conductor paths 8 by at least a factor of 10.

Furthermore, blind structures 12 are so provided, which are not electrically conductively connected to any of the conductor paths. These allow a homogeneous visual impression to be achieved, in such a way that in particular non-conductive areas, i.e. the gap areas between adjacent conductor path segments 6 and 7 are not conspicuous to the human eye. This results in a high degree of operator acceptance and very good operability when such a layered body is used in a touch screen.

The conductor path segments 6 of the sheet thus consist in each case of several first conductor paths 8, which are connected to each other by the second conductor paths 9 and the terminal electrodes 11. In the active areas of the layered body the conductor path segments 6 are formed by a conductor path pattern 13 which, as shown in FIG. 15*a* is formed by the conductor paths 8 and 9. The conductor path 30 segments 6 are galvanically separated from each other and arranged spaced apart by the non-conductive region at the distance 23, FIG. 15*b*. The width 22 of the conductor path segments 6 is determined, as indicated in FIG. 15*a*, by the distance to the outer contour of the respective conductor path segment 6, i.e., determined by the gap to the respective outer edge of the outermost conductor paths of the respective conductor path segment 6, which form the outer contour of the conductor path segment 6. The non-conductive area in the gap 23 between 5 the conductor path segments 6 is likewise determined by the gap between the outer contour of the conductor path segments 6, as also indicated in FIG. 15*b*.

Figure 15B:
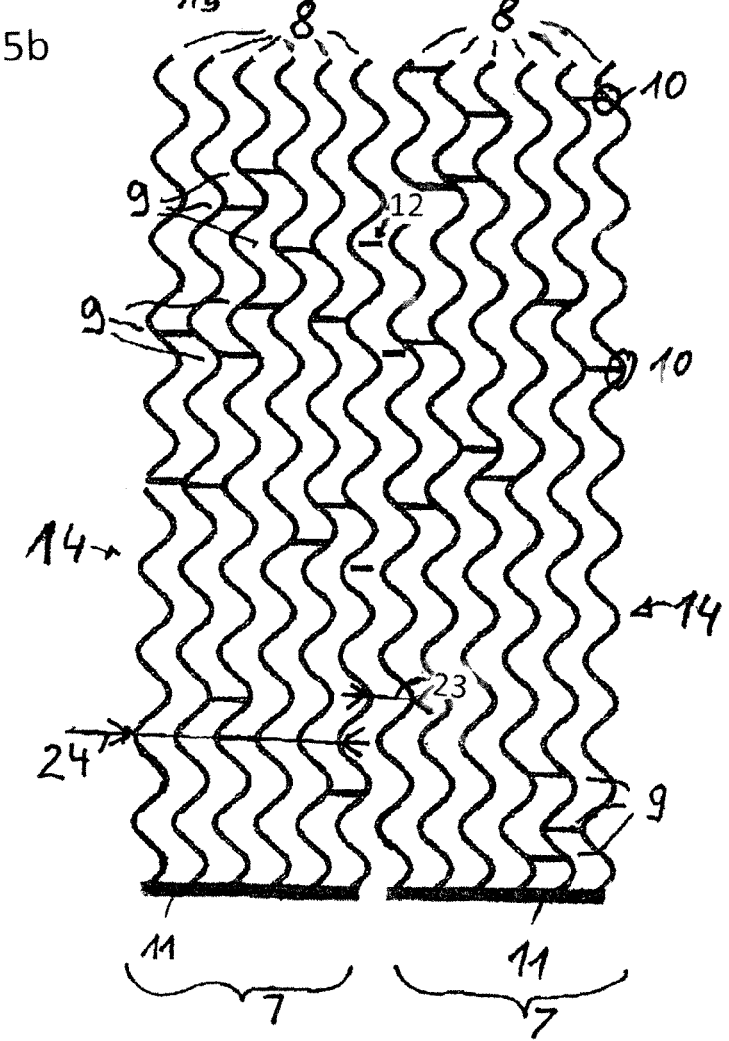

FIG. 15*b* shows the corresponding design of the conductor path segments 7, which are likewise formed by first conductor paths 8 running in wavy lines, arranged substantially parallel to each other, second conductor paths 9 forming cross-links and a terminal electrode 11. Furthermore FIG. 15*b* also shows intersection points 10 between first conductor paths 8 and second conductor paths 9 and also shows blind structures 12 arranged between the first conductor paths 8. The conductor path segments 7 are formed in the active area of the layered body of a conductor path pattern 14 by the conductor paths 8 and 9. With regard to the design of the conductor paths 8, 9 and the terminal electrode 11 reference may be made to the relevant embodiments with respect to the conductor paths 8, 9 and terminal electrode 11 according to FIG. 15*a*.

In this embodiment the conductor path segments 6 are formed throughout the entire area according to the conductor path pattern 13 shown in FIG. 15*a* and the conductor path segments 7 are formed according to the conductor path pattern 14 shown in FIG. 15*b*. In each of the intersection areas 5 in FIG. 15*c* the conductor path segment 6 is, furthermore, formed according to the conductor path pattern 13 with several first conductor paths 8 and several second conductor paths 9. In each of the intersection areas 5 the conductor path segment 7 is, furthermore, formed in the form of the conductor path pattern 14 with several first conductor paths 8 and several second conductor paths 9.

FIG. 15*c* shows the superimposition of two conductor path segments 6 and two conductor path segments 7 and thus the corresponding arrangement of the conductor paths of the conductor path patterns 13 and 14 in the area of intersection areas 5. As shown in FIG. 15*c*, the conductor paths 8 and 9 here run substantially in the longitudinal direction of the respective conductor path segments 6 or 7, in such a way that the intersection area 5 shown in FIG. 15*c* is formed with the pattern 15. Like the intersection areas of the FIGS. 5 to 8 and 10 to 12 and FIGS. 14, 16 and 17 shown embodiments, the pattern free of moiré effects.

Figure 16A:
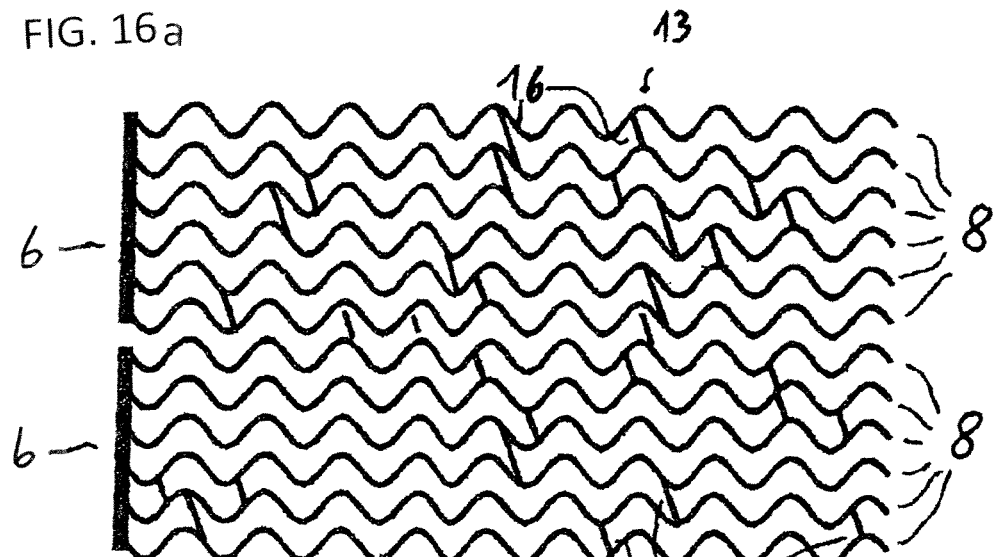
Figure 16B:
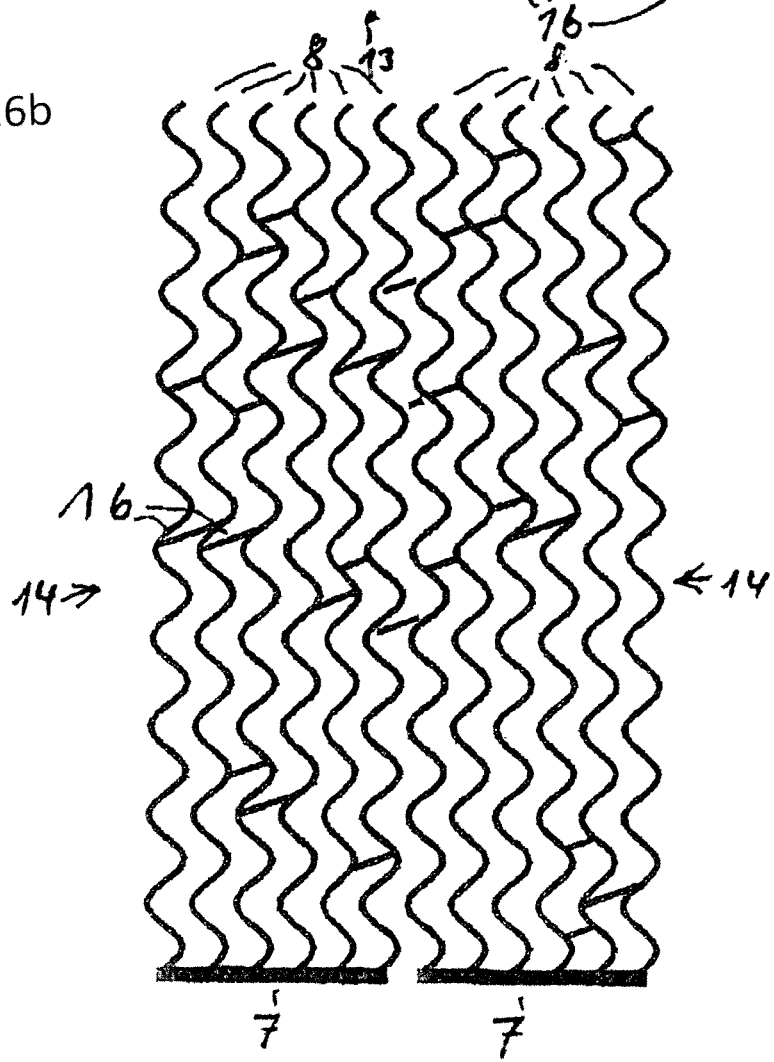
Figure 16C:
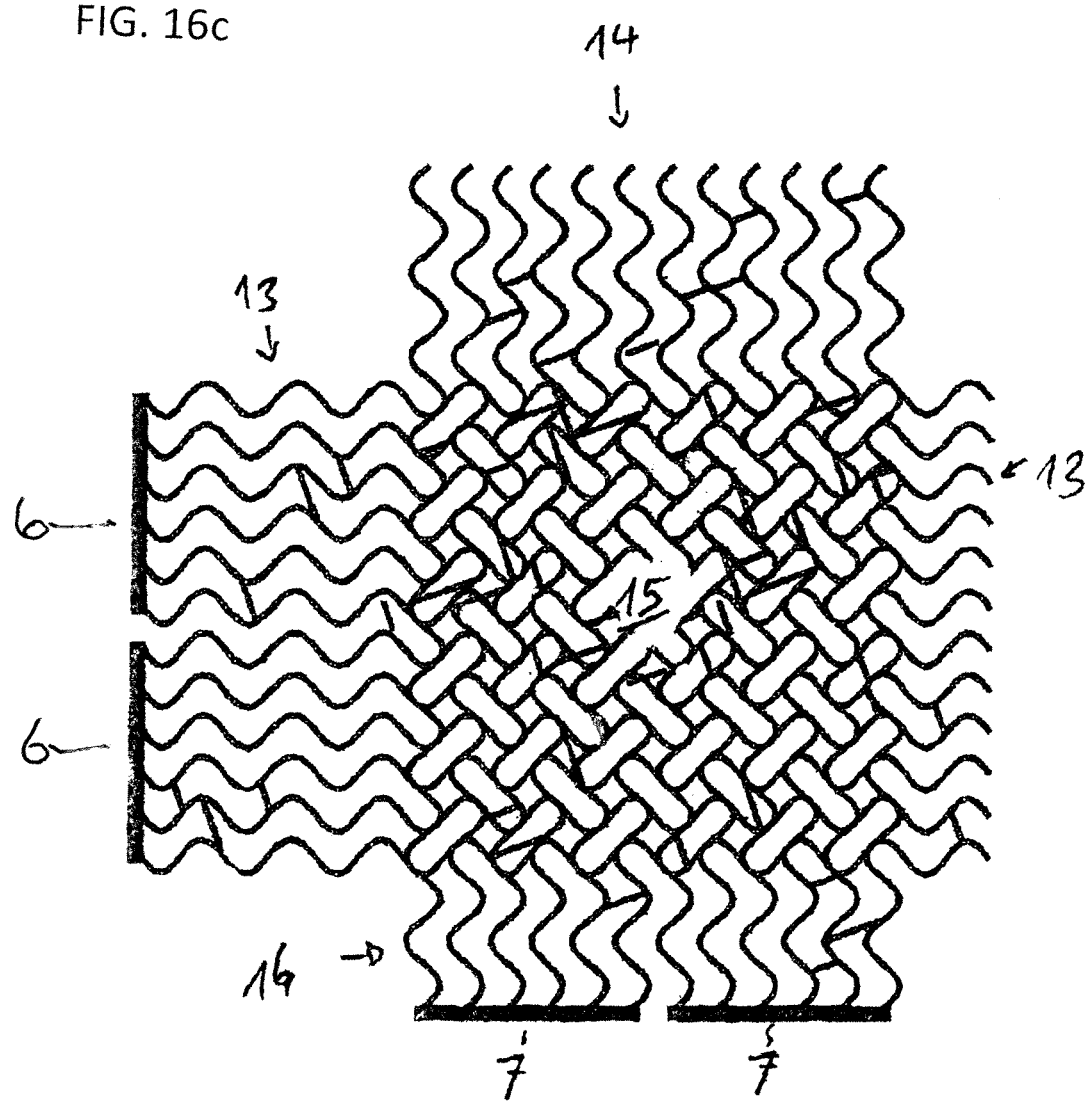

FIG. 16*a* to FIG. 16*c* show further embodiments of the conductor path patterns 13 and 14, according to which the conductor path segments 6 and 7 are formed. The conductor path patterns 13 and 14 according to FIG. 16*a* to FIG. 16*c* differ from the conductor path patterns 13 and 14 according to FIG. 15*a* to FIG. 15*c* only in that the second conductor paths 9, which are formed as cross-links, are replaced by second conductor paths 16. The second conductor paths 16 are here no longer oriented transversely to the conductor paths 8 at an angle of 90°, but are oriented to the average longitudinal direction of these conductor paths at an angle of between 80° and 10°. This results in the advantage of largely preventing the cross-links from completely covering individual image pixels of a display element for example lying beneath.

For the rest, reference may be made to the embodiments according to FIG. 15*a* to FIG. 15*c*.

Figure 17A:
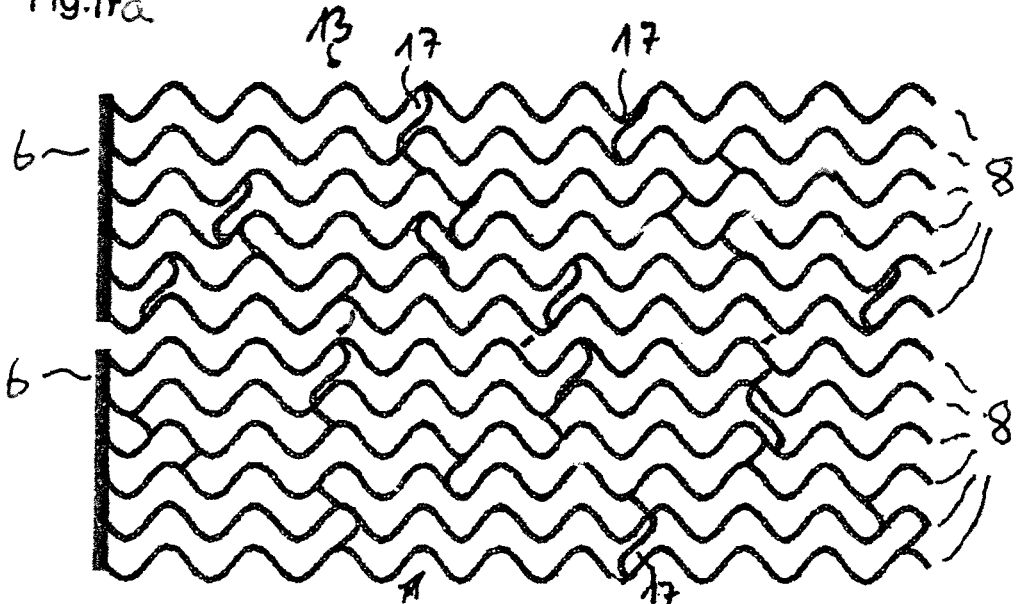
Figure 17B:
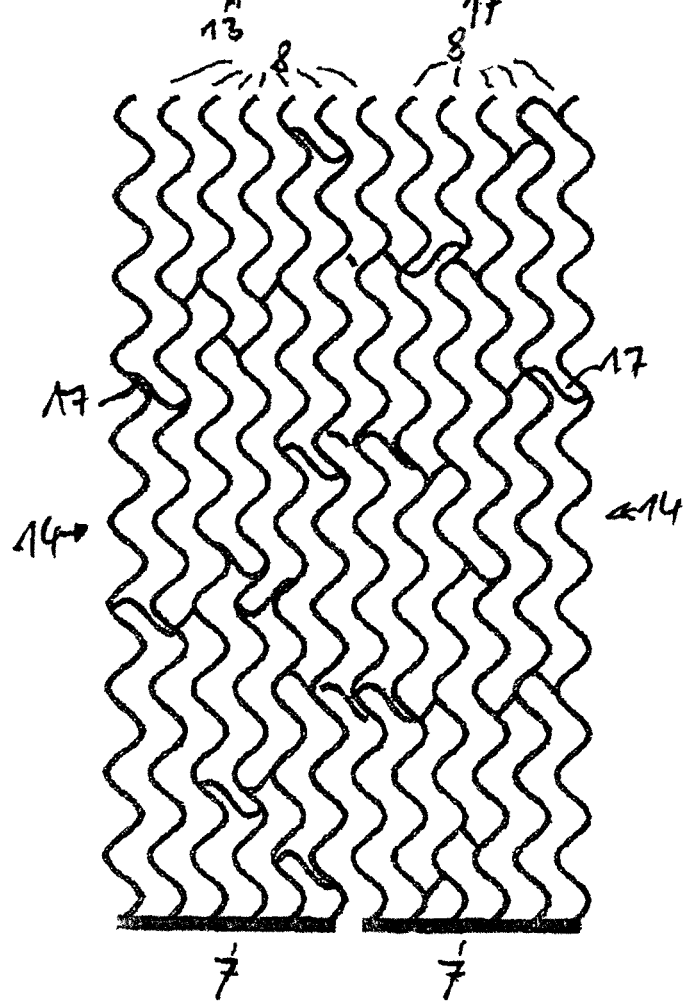

The conductor path patterns 13 and 14 of the embodiment example according to FIG. 17*a* to FIG. 17*c* corresponds to the conductor path patterns 13 and 14 according to FIG. 15*a* to FIG. 15*c*, with the difference that the second conductor paths 9 are replaced by second conductor paths 17. The second conductor paths 17 are here also formed as wavy lines or bent and in each case form cross-links, which bring two or three adjacent first conductor paths 8 into electrical contact with each other. Such a design of the cross-links results in the advantage already explained with the help of Figures FIG. 16a to FIG. 16c as well as in addition further reducing the formation of optical interference effects.

For the rest, with respect to the design of the conductor path segments 6 and 7 according to FIG. 17a to FIG. 17c reference may also be made to the relevant embodiments according to FIG. 15a to FIG. 15c.

In FIGS. 14 to 17 in each case intersection areas are formed by superimposing two identically structured sheets. The invention is not however limited to such layered bodies, but likewise covers embodiments in which a first sheet which for example has a grid structure from FIG. 15a, is combined with a second sheet which shows another grid structure, for example that from FIG. 14, to form a layered body.

The invention relates to a layered body, in particular one with two sheets of electric functional layers, as well as a use of this layered body for example in a touch screen with improved resolution. By changing the grid structure in the active areas and/or at the intersection areas a moiré effect can be avoided by superimposition of the grid structures of the individual sheets.

The invention claimed is:

1. A layered body comprising:
   at least one transparent support; and
   at least two sheets of electrically conductive and transparent functional layers with conductive, non-transparent conductor paths on the at least one transparent support, the at least two sheets being so extensive that one of individual conductor paths or grid structures consisting of conductor paths of a first of said sheets form intersection areas with one of individual conductor paths or grid structures of a second of said sheets in the layer construction of said body;
   wherein at least one of the first and second sheets has a grid structure consisting of conductor paths which is non-periodic, wherein the grid structure has a plurality of first conductor paths arranged substantially parallel to each other, and a plurality of second conductor paths which are transverse conductor paths, wherein in each case two or more of the first conductor paths are connected by the second conductor paths and the second conductor paths are arranged randomly or quasi-randomly.

2. The layered body according to claim 1, wherein the second conductor paths, which are transverse conductor paths, are arranged at one of a random or quasi-random distance from each other.

3. The layered body according to claim 1 wherein the non-periodicity of the grid structure is present at the intersection areas.

4. The layered body according to claim 1 wherein the non-periodicity of the grid structure is realized by a change of the grid constant.

5. The layered body according to claim 1 wherein the non-periodicity of the grid structure is realized by narrowing or discontinuation of individual conductor paths.

6. The layered body according to claim 1 wherein a difference in the periodicity of the grid structure in the edge area of the intersection areas is not identical to a difference in the periodicity of the grid structure at the intersection area.

7. The layered body according to claim 1 wherein a difference in the periodicity of the grid structure in an edge area and/or at the intersection area is realized by omission of individual conductor paths.

8. The layered body according to claim 1 wherein a difference in the periodicity of the grid structure in the edge area is realized by narrowing of the conductor paths, resolution of the conductor paths into increasingly smaller symbols and/or increasing the distance between the symbols.

9. The layered body according to claim 1 wherein in an active area of the layered body the average area of coverage of at least one transparent functional layer with the non-transparent conductor paths, in particular with the conductor paths of the grid structure has of not more than 10%.

10. The layered body according to claim 1 wherein the conductor path width of the conductor paths of the grid structure is less than 20 μm.

11. The layered body according to claim 1 wherein the distance between the conductor paths of the grid structure is at least 100 μm.

12. The layered body according to claim 1 wherein the levels of the functional layers have realized a distance from each other of less than 30 μm in the stack of layers forming the layered body.

13. The layered body according to claim 1 wherein the area coverage of the transparent conductive functional layer in the projection through the two sheets onto a substrate parallel to the first and the second sheet with non-transparent conductor paths in the intersection area is less than double the area coverage outside the intersection areas in the grid structure.

14. The layered body according to claim 1 wherein the thickness of the conductor paths is less than 200 nm.

15. The layered body according to claim 1 wherein the material of the non-transparent conductor path is metal or a metal alloy.

16. The layered body according to claim 1 wherein the transparent support consists of a transparent plastic film.

17. The layered body according to claim 1 wherein the grid structure of the first sheet is formed in a diamond structure with two kinds of diamond patterns, in such a way that in a layer construction of the layered body consisting of two sheets, a second sheet connects the diamond pattern of the first sheet only electrically.

18. The layered body according to claim 1 wherein the grid structure consisting of conductor paths is non-periodic over one of the entire active area of the layered body, over a conductor path segment or in areas.

19. The layered body according to claim 18 wherein a surface covered by the second conductor paths covers less than 10% of the surface covered by the first conductor paths and the second conductor paths.

20. The layered body according to claim 18 wherein the second conductor paths are arranged substantially parallel to each other.

21. The layered body according to claim 18, wherein the second conductor paths and the first conductor paths are at an angle of between 85 degrees and 95 degrees to each other.

22. The layered body according to claim 18, wherein the azimuth angle of the first conductor paths is varied according to a function, in particular according to a periodic function.

23. The layered body according to claim 18 wherein the first conductor paths are oriented parallel to a first preferred direction and/or the direction of the first conductor paths averaged over a period in each case are oriented parallel to a first preferred direction.

24. The layered body according to claim 18 wherein the spatial frequency, amplitude and/or phase of the function varying the azimuth angle of the first conductor paths is selected different in one portion relative to an adjacent portion, wherein the difference between the spatial frequency, amplitude or phase of the one portion and of the adjacent portion is less than 10%.

25. The layered body according to claim 24 wherein a plurality of portions follow one another and the difference between the spatial frequency, amplitude and/or phase of the function of consecutive portions is selected randomly or quasi-randomly.

26. The layered body according to claim 1 wherein the first sheet and the second sheet have a grid structure consisting of conductor paths and both the grid structure consisting of conductor paths of the first sheet and the grid structure consisting of conductor paths of the second sheet are non-periodic.

27. The layered body according to claim 1 wherein the grid structure consisting of conductor paths of the first sheet has a plurality of first conductor paths arranged substantially parallel, and a plurality of second conductor paths which are transverse conductor paths, which in each case connect two or more of the first conductor paths, and the grid structure consisting of conductor paths of the second sheet has a plurality of first conductor paths arranged substantially parallel, and a plurality of second conductor paths which are transverse conductor paths, which in each case connect two or more of the first conductor paths of the second sheet.

28. The layered body according to claim 1 including conductor path segments on the first and second sheets, wherein the first conductor paths and/or conductor path segments of the first sheet and the first conductor paths and/or conductor path segments of the second sheet in each case, at least in areas, have an intersection angle of one of between 85° and 95° to each other, or in the direction of the first conductor paths and/or conductor path segments of the first sheet and in the direction of the first conductor paths and/or conductor path segments of the second sheet are at an angle of between 85° and 95° to each other.

29. The layered body according to claim 1 including a conductor path segment and terminal electrodes of a respective conductor path segment on each of the first and second sheets wherein a direction of the first conductor paths of the first and/or of the second sheet and/or a direction of the second conductor paths are not oriented one of parallel to a connecting line between the terminal electrodes of the respective conductor path segment and at an angle of approximately 45 degrees to a straight line connecting the terminal electrodes of the respective conductor path segments.

30. The layered body according to claim 1 wherein in an active area of the layered body, the average area coverage is constant relative to a surface area of 0.3×0.3 mm of the conductor paths of the grid structure.

31. The layered body according to claim 1 wherein in an active area of the layered body, the average area coverage of the projection of the conductor paths of the first and second sheets onto a substrate arranged parallel to the first and second sheets is constant relative to a surface area of 0.3×0.3 mm.

32. The layered body according to claim 31 wherein the average area coverage of the projection of the conductor paths of the first and second sheets onto a substrate arranged parallel to the first and second sheets is constant when the grid structures consisting of conductor paths of the first sheet and the grid structures consisting of conductor paths of the second sheet are displaced not more than 1 mm and/or rotated through an angle of not more than 3°.

33. A method for producing a layered body further including conductor segments according to claim 1 by lamination of two sheets in a stack on a substrate, wherein an insulation layer is arranged between the two electrically conductive layers which comprise two transparent functional layers with conductive, non-transparent conductor paths on a transparent support, wherein the pattern of the grid structure of the conductor paths or conductor path segments of the individual sheets is selected in such a way that manufacturing defects resulting from the sheets not fitting accurately when laminated on top of one another are offset.

34. A method for producing a layered body according to claim 1 wherein the two electrically conductive sheets are produced from one printed strip.

35. The layered body of claim 1 wherein the layered body includes structure arranged as a touch screen.

36. A layered body comprising:
at least two sheets of electrically conductive and transparent functional layers with conductive, non-transparent conductor paths on at least one transparent support, so extensive that individual conductor paths or grid structures consisting of conductor paths or conductor segments of a first sheet form intersection areas with individual conductor paths or grid structures of a second sheet in the layer construction;
wherein in an active area of the layered body the average area coverage is constant relative to a surface area of 0.3×0.3 mm of the first and/or second sheet and/or of conductor path segments with the conductor paths of the grid structure.

37. A layered body comprising:
at least two sheets of electrically conductive and transparent functional layers with conductive, non-transparent conductor paths on at least one transparent support, so extensive that individual conductor paths or grid structures consisting of conductor paths of the first sheet form intersection areas with individual conductor paths or grid structures of the second sheet in the layer construction;
wherein in an active area of the layered body the average area coverage of a projection of the conductor paths of the first and second sheets onto a substrate arranged parallel to the first and second sheets is constant relative to a surface area of 0.3×0.3 mm.

38. The layered body according to claim 37 wherein the average area coverage of the projection of the conductor paths of the first and second sheets onto a substrate arranged parallel to the first and second sheets is constant when the grid structures consisting of conductor paths of the first sheet and the grid structures consisting of conductor paths of the second sheet are displaced not more than 1 mm and/or rotated through an angle of not more than 3°.

* * * * *